United States Patent [19]
Nishimura

[11] Patent Number: 6,104,632
[45] Date of Patent: Aug. 15, 2000

[54] MAGNETIC THIN FILM MEMORY AND RECORDING AND REPRODUCING METHOD AND APPARATUS USING SUCH A MEMORY

[75] Inventor: Naoki Nishimura, Ohmorinishi, Japan

[73] Assignee: Canon Kabushiki Kaisha, Tokyo, Japan

[21] Appl. No.: 09/313,176

[22] Filed: May 18, 1999

[30] Foreign Application Priority Data

| May 18, 1998 | [JP] | Japan | 10-135564 |
| Jun. 15, 1998 | [JP] | Japan | 10-167192 |
| Jun. 15, 1998 | [JP] | Japan | 10-167295 |
| Dec. 17, 1998 | [JP] | Japan | 10-359633 |

[51] Int. Cl.[7] .................................. G11C 11/00
[52] U.S. Cl. .......................... 365/158; 365/171
[58] Field of Search .................. 365/158, 171, 365/173, 66, 50

[56] References Cited

U.S. PATENT DOCUMENTS

| 5,173,873 | 12/1992 | Wu et al. | 365/173 |
| 5,432,734 | 7/1995 | Kawano et al. | 365/158 |
| 5,898,612 | 4/1999 | Chen et al. | 365/158 |

FOREIGN PATENT DOCUMENTS

| 7-066033 | 3/1995 | Japan . |
| 10-116490 | 5/1998 | Japan . |

OTHER PUBLICATIONS

Patent Abstract of Japan, vol. 1997, No. 7, Jul. 31, 1997 & JP 09 073773 A (Seiko Epson Corp), Mar. 18, 1997.
Patent Abstracts of Japan, vol. 1997, No. , Jun. 30, 1997 & JP 09 050692A (Seiko Epson Corp), Feb. 18, 1997.
Patent Abstracts of Japan, vol. 1988, No. 10, Aug. 31, 1988 & JP 10 134560A (Victor Co. of Japan Ltd), May 22, 1998.

*Primary Examiner*—David Nelms
*Assistant Examiner*—David Lam
*Attorney, Agent, or Firm*—Fitzpatrick, Cella, Harper & Scinto

[57] ABSTRACT

A magnetic thin film memory includes a stack of magnetic thin film devices each comprising a first magnetic layer, a second magnetic layer of higher coercive force than the first magnetic layer on the first magnetic layer, and a non-magnetic layer between the first magnetic layer and the second magnetic layer. A conductive write wire separated from each magnetic thin film device by an insulator enables the application of a magnetic field. A pair of electrodes enables electric current flow through the magnetic layers in order to detect changes in magnetoresistance dependent on information recorded in the devices.

17 Claims, 18 Drawing Sheets

MAGNETIC THIN FILM MEMORY AND RECORDING AND REPRODUCING METHOD AND APPARATUS USING SUCH A MEMORY

BACKGROUND OF THE INVENTION

1. Related Art

This invention relates to a magnetic thin film memory, and a recording and reproducing method; in which information is recorded using the direction of magnetization and the recorded information is reproduced utilizing Giant Magnetoresistance.

2. Prior Art

A semiconductor memory is a well-known conventional static solid memory. The semiconductor memory may be a volatile memory, such as a DRAM, which loses the recorded information if the power supply is cut off, or an involatile memory, such as a flash memory or ferroelectric memory, which do not lose the information even if the power supply is cut off.

In a DRAM, in the form of a ferroelectric memory, the recorded information is stored in a capacitor. The information is recorded by the storing or absence of a charge in the capacitor, or by the direction of the polarization. Thus, at least one transistor is needed per memory cell. In a flash memory, the information is recorded by changing the threshold voltage of a control gate dependent on whether a charge is stored or not in a floating gate. Thus, at least one transistor is also needed per memory cell.

The transistor is made by injecting an impurity element such as boron, phosphorus etc. in a Si crystal to form a p-type or n-type semiconductor. The Si crystal must have a structure with no defects in order to get appropriate values of the physical properties of the band structure. Also, a Si crystal is required having sufficient thickness to withstand injection of the impurity element. For these reasons, it is very difficult to form a Si film on the Si substrate, to produce the overlaid transistor.

Accordingly, in a conventional semiconductor memory, it has not been possible to overlie a plurality of memory cells in the direction of thickness of the memory.

A volatile magnetic solid memory utilizing Giant Magnetoresistance is now also being proposed. For example, U.S. Pat. No. 5,432,734 (corresponding to Japanese Patent Application No. 7-66033) shows the matrix structure of a magnetic memory as shown in FIGS. 1A and 1B, in which:

FIG. 1A is a plan view of the memory; and

FIG. 1B is a schematic sectional view along the line I—I in FIG. 1A.

A plurality of magnetoresistive (MR) devices 61 are provided as a matrix structure on the substrate 60. Each MR device 61 is composed of a Giant Magnetoresistive film comprising a non-magnetic layer between two magnetic layers. The digital data is stored by means of the direction of magnetization of the magnetic layer having the lower coercive force. The magnetization of the magnetic layer having the higher coercive force is oriented in a predetermined direction. The recording is performed by supplying an electric current into a word wire W1–W5 provided on the top of the magnetic layer and into a sense wire S1–S5, causing the portions at which the word wire and the sense wire cross each other to generate a big magnetic field. The reproducing is performed by reversing the direction of the magnetization of the magnetic layer having the lower coercive force and then detecting the resistance change. Thus, after reproducing, rewriting is required.

U.S. Pat. No. 5,432,734 describes a memory device connected in series arranged in one layer on the substrate. In this structure, it is impossible to increase the integration rate in the limited area available.

A highly integrated magnetic thin film memory in which the plurality of the magnetoresistive devices are overlaid is described in Japanese Patent Application Publication No. 10-116490. The structure of the magnetic thin film memory is shown in FIGS. 2A and 2B in which:

FIG. 2A shows a perspective view of the memory; and

FIG. 2B shows a sectional view along line II—II of FIG. 2A.

In FIGS. 2A and 2B, 70 indicates the magnetic thin film layers whilst 71 indicates the semiconductor substrate. 72$a$, $b$, $c$, $d$ indicate Giant Magnetoresistive (GMR) portions. 73$a$, $b$, $c$, $d$, $e$, $f$ indicate word wires. 74$a$, $b$, $c$, $d$, $e$ indicate sense wires. 83 indicates a conductor linking the sense wires 74$a$, 74$c$. 84 indicates layers of a dielectric material. In this magnetic thin film memory, a plurality of GMR portions are overlaid in the direction of thickness of the memory. Therefore it is possible to write a number of bits in the size of one cell and to thus increase the rate of integration. However, in the magnetic thin film memory described in Japanese Patent Application Publication No. 10-116490, it has been difficult to increase the speed of readout out due to the influence of the wiring because the electric current flows in the direction parallel to the surface of the magnetic layer when reproducing the information.

Also, in the magnetic thin film memory described in Japanese Patent Application Publication No: 10-116490, if a third GMR portion is overlaid on the top layer of dielectric material 84, because the GMR portions in each layer must be connected in series as shown in FIG. 2A and FIG. 2B, another conductor must connect the sense wire of the GMR portions in such a third layer with the GMR portions 72$c$, $d$ in the second layer arranged at the opposite side of the sense wires 74 to the conductor 83 so that the sense wire 74 of the second layer is connected with the sense wire of the GMR portions in the third additional layer. As a result, the conductor 83 must be staggered in each layer. This leads to an increase in production processing. and thus production costs.

SUMMARY OF THE INVENTION

It is an object of this invention to at least alleviate the above conventional problems. In particular an object is to provide a magnetic thin film memory which may have a high integration rate, high read out speed, low production cost, and easy production processes.

According to the present invention, there is provided a magnetic thin film memory comprising:

a stack of magnetic thin film devices each device comprising a first magnetic layer, a second magnetic layer of higher coercive force than the first magnetic layer, and a non-magnetic layer between the first magnetic layer and the second magnetic layer, write wire means adjacent each magnetic thin film device, and electrode means for enabling electric current to flow through each magnetic layer in order to detect magnetoresistance changes; wherein the magnetic layers and the electrode means are arranged to enable electric current to flow through the stack of magnetic layers.

BRIEF DESCRIPTION OF THE DRAWINGS

An embodiment of the invention will now be described, by way of example only, with reference to the accompanying drawings in which.

PREFERRED EMBODIMENTS OF THE INVENTION

First Embodiment

Figure 3:
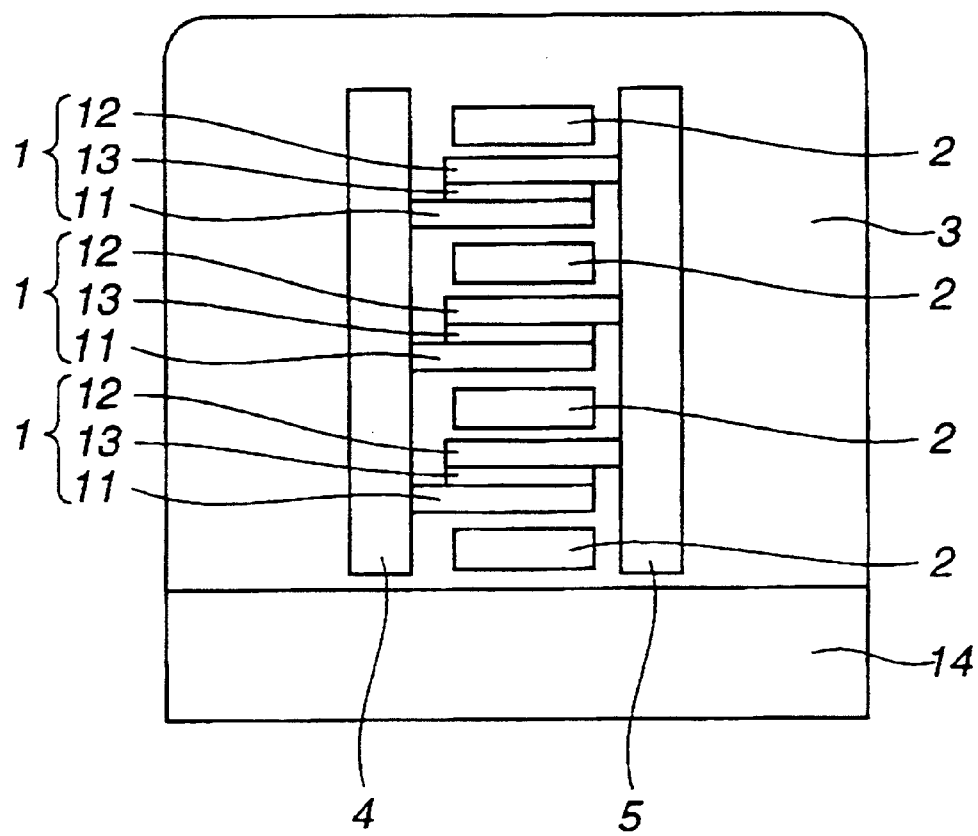
FIG. 3 illustrates a sectional view of a first embodiment of present invention.

FIG. 3 illustrates a magnetic thin film memory including a magnetoresistive film (MR) in which a magnetoresistive effect occurs due to spin dependent scattering.

The magnetoresistive effect due to spin dependent scattering results from scattering of conduction electrons of different spin.

In particular, where the conduction electrodes have a spin in the same direction as the direction of magnetization, the electrons are not largely scattered, giving a small resistance value. However, where the conduction electrons have a spin in the opposite direction to the direction of the magnetization, the electrons are largely scattered, giving a larger value of resistance. Thus, where the directions of magnetization of a first magnetic layer of a second magnetic layer are opposite each other, the resistance value is larger than where the layers have the same direction of magnetization.

As shown in FIG. 3, the magnetic thin film memory of this embodiment is structured to have a number of magnetic thin film memory layer devices, each of which is composed of a magnetoresistive film 1 in which the information is recorded, and a write wire 2 comprising a metal having a good conductivity provided near the magnetoresistive film 1. The devices are connected in parallel in the same plane, with two or more devices overlaid on the substrate 14.

Each magnetoresistive film 1 is composed of a first magnetic layer 11, a second magnetic layer 12 which overlies the first magnetic layer 1 and has a higher coercive force than that of the first magnetic layer 11, and a non-magnetic layer 13 provided between the first magnetic layer 11 and the second magnetic layer 12. The first magnetic layer 11 of each magnetoresistive film 1 is connected to an electrode 4, whilst the second magnetic layer 12 of each magnetoresistive film 1 is connected to an electrode 5.

When information is reproduced, electric current is supplied through each electrode in the direction of thickness of the memory, that is in a direction perpendicular to the surface of each magnetic layer. The electrodes 4 and 5 are connected to a sense circuit (not shown) in order to detect the resistance change between the electrodes 4, 5.

The electrodes 4 and 5 preferably consist of a good conductor having a small resistance. Thereby the resistance value of the memory unrelated to the storage of the information can be minimised and it is possible to make the memory device have a good S/N. Suitable good conductors are preferably materials, such as those including Al, Cu, etc., in which the electric resistance value is smaller than that of the magnetoresistive film. Alternatively, in order to remove the bad influence of the spin curling generated at the end of the magnetoresistive film when the magnetoresistive film is formed as a short film and to improve the orientation properties of the spins, the electrodes 4 and 5 may consist of a soft magnetic material such as a perpendicular magnetic film such as NiFe, FeN, GdFe, or may be composed of a dual property structure having an exterior consisting of a good conductor and an interior consisting of a soft magnetic layer or a perpendicular magnetic layer.

The write wire 2 is provided near the magnetoresistive film 1. The write wire 2 is provided to determine the direction of magnetization of the magnetoresistive film produced by the magnetic field generated when the electric current flows into the write wire 2 in the perpendicular direction, i.e. into the plane of the drawing. The direction of the magnetization can be changed by means of the direction of the electric current, whilst the strength of the magnetic field can be changed dependent on the amount of the electric current. An insulator 3 consisting of $SiO_2$, $SiN_x$, etc., is preferably provided between the magnetoresistive film 1 and the write wire 2 in order to prevent electrical connections between the write wire 2 and the magnetoresistive film 1.

Figure 4A:
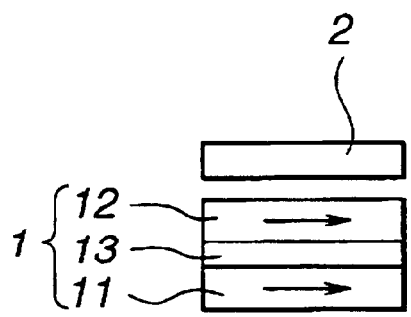
FIGS. 4A and 4B illustrate two states of magnetization of the magnetoresistive film in the first embodiment.
Figure 4B:
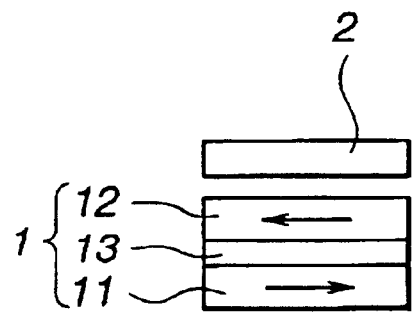

FIGS. 4A and 4B show the magnetic states of the magnetoresistive films 1 of FIG. 3. As shown in FIGS. 4A and 4B, each magnetoresistive film 1 is composed of a first magnetic layer 11 having a low coercive force and being orientated to have a magnetization mainly in one direction in the plane of the layer, and a second magnetic layer 12 having a higher coercive force and having a magnetization orientated mainly in one direction in the plane of the layer, overlying the first magnetic layer 11, but separated by the non-magnetic layer 13. The first magnetic layer 11 is provided to reproduce the information stored in the second magnetic layer 12 using the Giant Magnetoresistive effect. The second magnetic layer 12 is provided in order to store the information.

The magnetoresistive film 1 has a low resistance when the directions of the magnetization of the first magnetic layer 11 and of the second magnetic layer 12 are parallel to each other as shown in FIG. 4A, and has a high resistance when they are antiparallel as shown in FIG. 4B. Therefore, as shown in FIG. 4A and FIG. 4B, by setting the digital information of "0"s and "1"s to correspond to the directions of the magnetization of the second magnetic layer 12, as described below, the recorded digital information can be detected by the resistance change. The information is recorded such that one bit is recorded by one write wire. Thus, if there are N write wires 2, it is possible to store N bits of information.

The coercive force of the first magnetic layer 11 is preferably between 2 Oe and 20 Oe. The coercive force of the second magnetic layer 12 is preferably between 5 Oe and 50 Oe. The coercive force of the first magnetic layer 11 is preferably set at approximately half that of the second magnetic layer.

In FIGS. 4A and 4B, although the second magnetic layer 12 is arranged adjacent to the write wire 2, the first magnetic layer 11 may be arranged adjacent to the write wire 2. However, as the magnetic layer having the higher coercive force needs a larger magnetic field to reverse the magnetization, preferably the second magnetic layer 12 is arranged closer to the write wire 2 than the first magnetic layer 11 in order to decrease the consumption of electric current.

Figure 1A:
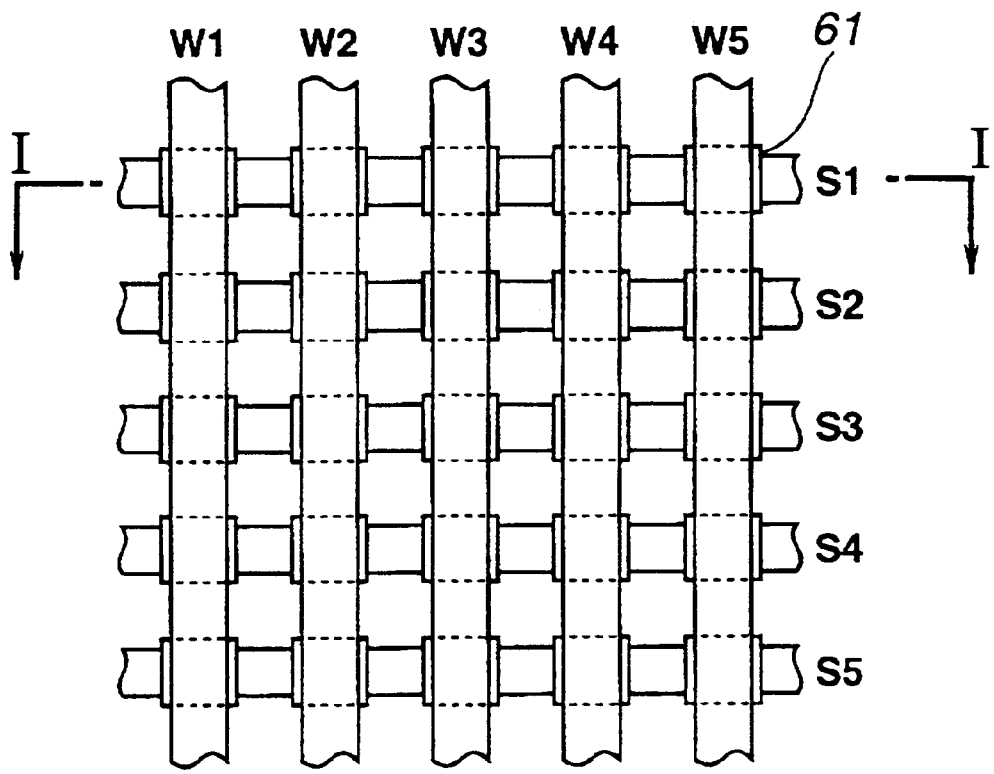
FIGS. 1A and 1B illustrates a plan and a sectional view which show a example of a conventional magnetic thin film memory.
Figure 1B:
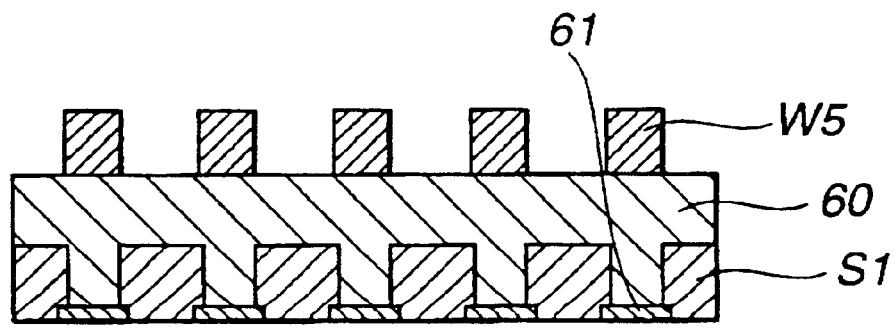

As shown in FIG. 3, the structure of the present invention is simpler than that of the conventional structure shown in FIGS. 1A and 1B, and can achieve a high integration because it is possible to record a plurality of bits in the area of one memory cell. Also it is unnecessary to rewrite after reproducing.

Figure 2A:
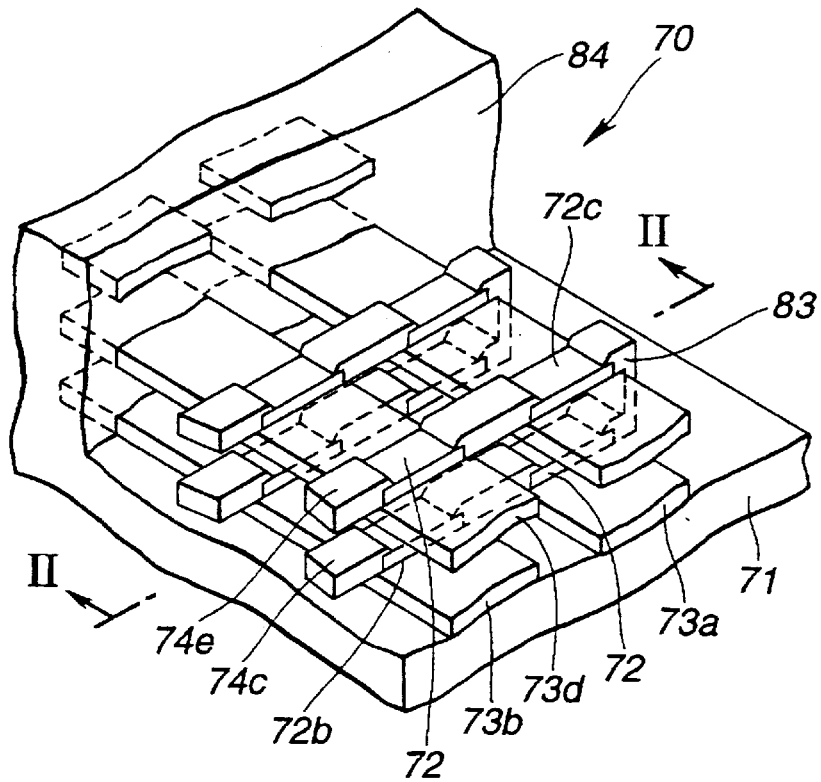
FIGS. 2A and 2B illustrates a plan and a sectional view which show another example of a conventional magnetic thin film memory.
Figure 2B:
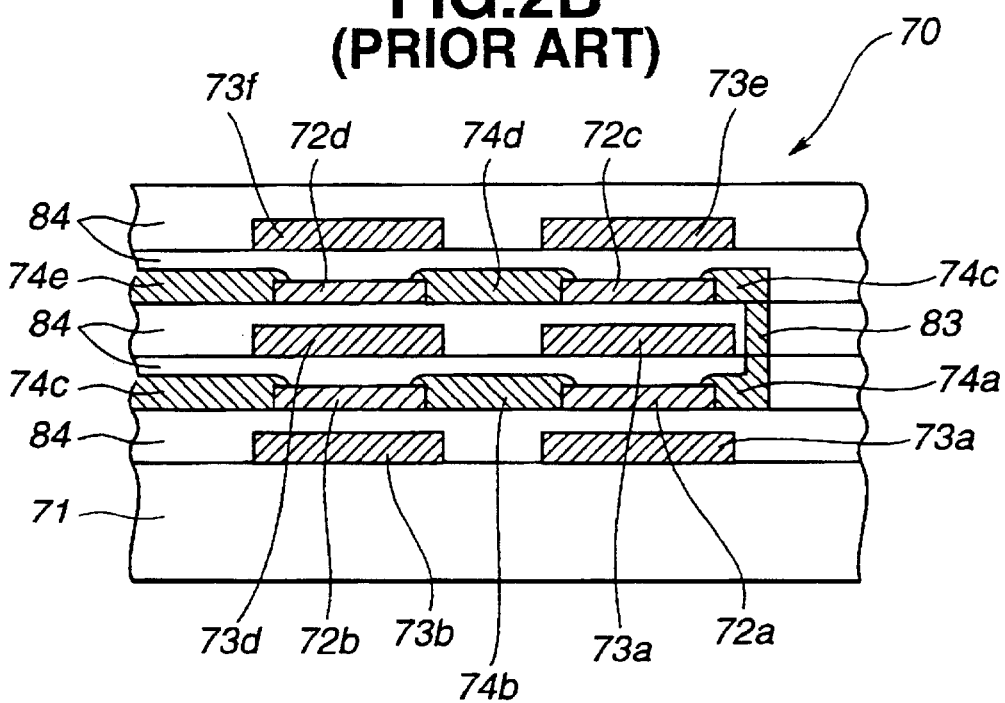

Furthermore, the magnetic thin film layer of the this embodiment can reduce problems in wiring and can reproduce at a high speed in comparison with the conventional magnetic thin film memory shown in FIGS. 2A and 2B because the electric current flows in the direction of thickness, that is in the perpendicular direction to the surface of each magnetic layer.

In this embodiment, if the number of memory devices connected in parallel increases, the speed of reproducing information declines because the time constant becomes larger, and the thermal noise increases in accordance with an increase of resistance value. In order to reduce these bad influences, the number of memory devices connected in parallel is preferably less than 256.

Also if the number of the memory devices which are connected in parallel is increased, the detected resistance change declines. For example, on the supposition that N magnetoresistive films are connected in parallel and the resistive value of one of them changes from a minimum value $R1_{min}$ to a maximum value $R1_{max}$ and further the resistive value of the other N−1 magnetoresistive films have the same resistive value $R1_{max}$, if the whole resistive value changes from a minimum value $RT_{min}$ to a maximum value $RT_{max}$, the ratio of the resistance change MRT of the whole memory device to the overall resistance with the films connected in parallel is defined by the following formula:

$$MRT=(RT_{max}-RT_{min})/RT_{min} \quad (1)$$

By utilizing the MR of the resistance change ratio of one magnetoresistive film as defined by the following formula (2), MRT can be indicated by the following formula (3):

$$MR=(R1_{max}-R1_{min})/R1_{min} \quad (2)$$

$$MRT=(1/N)MR \quad (3)$$

That is, the resistance change decreases in accordance with an increase of the number of the memory devices connected in parallel.

Also, if the value of resistance change ratio of the other N−1 magnetoresistive film is $R1_{min}$, MRT is indicated by the following formula:

$$MRT = \frac{MR}{MR(N-1)+N} \quad (4)$$

It can be understood that on the basis of the formulae (2) and (4), in the case of the parallel arrangement of the memory devices, if the other memory devices have a high resistance value, it is preferable on reproduction because the whole magnetic resistance ratio can be high. Therefore, the memory device of the present invention, for example utilizing a GMR layer, preferably has a structure where the magnetization of the first magnetic layer and the second magnetic layer are antiparallel to each other before reproduction because the conduction electrons are largely scattered when the conduction electrons in one magnetic layer enter into the other magnetic layer. This can be realized by, for example, setting the magnetic coupling such that the magnetization between the first magnetic layer and the second magnetic layer is antiparallel when the external magnetic field is zero.

In order to realize the present invention, at least two memory devices must be arranged in parallel. Therefore the number of the memory devices which are arranged in parallel is between 2 and 250, preferably less than 10, and more preferably less than 4.

When information is recorded in the magnetoresistive device of this embodiment, the magnetic field is generated by supplying electric current in the write wire 2 which is arranged on the magnetoresistive device 1 on which information is recorded. This electric current is called the write electric current. An electric current also flows in the magnetoresistive device in which is recorded information when the electric current flows in the write wire 2. This electric current is called the sense electric current. In order to prevent the write electric current leaking to the magnetoresistive device during recording, the write wire is separated from the magnetoresistive by an insulator 3, thus electrically insulating the write wire from the magnetoresistive device.

An orthogonal component of the magnetic field is generated on the basis of the write electric current and the sense electric current and is applied only during recording on the magnetoresistive device. Because the magnetic field intensity on the portion of the magnetoresistive device where the orthogonal component is applied is stronger than that of the other portions, it is possible to record the information in a particular device among a plurality of magnetoresistive devices.

Figure 5:
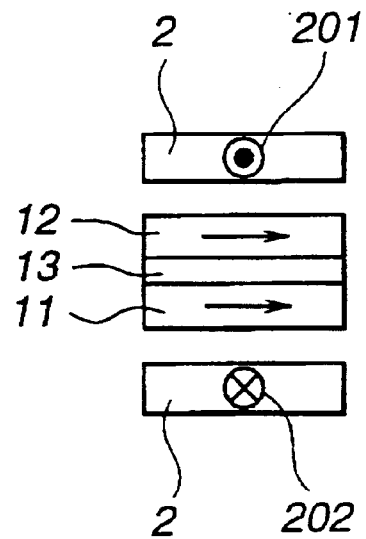
FIG. 5 illustrates an example of a structure provided with wiring for writing on both the upper and lower surfaces of the magnetoresistive film.

Referring now to FIG. 5, in the memory device of this embodiment, as two write wires 2 are positioned either side of the magnetoresistive film 11, 13, 12, if electric current is supplied in the upper write wire 2 and the lower write wire 2 in opposite directions, it is possible to increase the applied magnetic field. In FIG. 5, the electric current direction 201 indicates that the electric current flows in the upper write wire in the direction away from the drawing, and the electric current direction 202 indicates that the electric current flows in the lower write wire in the direction into the drawing. In this way, it is possible to apply a strong magnetic field in the right-hand direction to the magnetoresistive film as shown in FIG. 5. However, if the electric current direction is reversed, it is possible to apply a strong magnetic field in the left-hand direction to the magnetoresistive film. In the case where upper and lower write wires are used, as shown in FIG. 3, it is preferably that an additional write wire 2 is arranged at the base of the cells.

The characteristics of each magnetoresistive film used in the magnetic thin film memory of this embodiment are explained below.

It is preferable that the first magnetic layer 11 and the second magnetic layer 12 are composed of an amorphous alloy which includes at least one of Ni, Fe, Co as a major constituent or which consists of CoFe as the major constituent. For example, preferably the first and second magnetic layers are composed of a magnetic layer which consists of one of NiFe, NiFeCo, Fe, FeCo, Co, CoFeB, etc.

Materials for the First Magnetic Layer

The first magnetic layer has a lower coercive force than that of the second magnetic layer. The first magnetic layer preferably consists of a soft magnetic material including Ni. In particular, the soft magnetic material preferably consists of one of NiFe, NiFeCo as a major constituent, or consists of FeCo including mostly Fe, or consists of an amorphous magnetic material, i.e., CoFeB, which has a low coercive force.

In the atomic composition $Ni_xFe_yCo_z$ preferably x is between 40 and 95, y is between 0 and 40 and z is between 0 and 50. More preferably, x is between 50 and 90, y is between 0 and 30 and z is between 0 and 40. Still more preferably, x is between 60 and 85, y is between 10 and 25, and z is between 0 and 30.

For the atomic composition ratio for. $Fe_xCo_{100-x}$ preferably x is between 50 and 100. More preferably, x is between 60 and 90.

For the atomic composition $(Co_xFe_{100-x})_{100-y}B_y$ preferably x is between 80 and 96, y is between 5 and 30. More preferably x is between 86 and 93 and y is between 10 and 25.

Materials for the Second Magnetic Layer

The second magnetic layer has a higher coercive force than that of the first magnetic layer. The second magnetic layer preferably consists of a magnetic material including more Co in comparison to the first magnetic layer.

In the atomic composition $Ni_xFe_yCo_z$ preferably x is between 0 and 40, y is between 0 and 50 and z is between 20 and 95. More preferably, x is between 0 and 30, y is between 5 and 40 and z is between 40 and 90. Still more preferably, x is between 5 and 20, y is between 10 and 30 and z is between 50 and 85.

Also in the atomic composition ratio $Fe_xCo_{100-x}$ it is preferable that x is between 0 and 50.

Also an additive atom, for example Pt, etc., is preferably added in the second magnetic layer in order to improve the corrosion resistance or to control the coercive force.

How to Control the Coercive Force

If Fe is added to Co, the coercive force of the magnetic layer becomes lower. If Pt is added to Co, the coercive force becomes higher. Accordingly the coercive force of the second magnetic layer $Co_{100-x-y}Fe_xPt_y$ can be controlled by adjusting the atomic composition, i.e., varying x. The coercive force can also be lowered by adding Ni.

Alternatively, because the coercive force becomes higher by raising the temperature of the substrate while the magnetic layer is being formed, the coercive force can be controlled by adjusting the temperature of the substrate during formation of the magnetic layer. This may be combined with adjustment of the composition ratio. The coercive force of the first magnetic layer can be controlled in the same way.

Finally, because the coercive force of the magnetic layer becomes higher by increasing the thickness of the layer, the coercive force may be controlled by adjusting the thickness.

Thickness of the First Magnetic Layer

The thickness of the first magnetic layer must be set so that a giant magnetoresistive effect of the scattering type is efficiently produced. In particular, if the thickness of the first magnetic layer largely exceeds the mean free path of the electrons, the effect decreases because of phonon scattering, and thus the thickness is preferably at least 200 Å or less, more preferably 150 Å or less. However, if the first magnetic layer is excessively thin, the reproduction signal level decreases because the resistance of the cell decreases, and also it become difficult to maintain the magnetization. Therefore the thickness of the first magnetic layer is preferably 20 Å or more, and more preferably 80 Å or more.

Thickness of the Second Magnetic Layer

Since the thickness of the second magnetic layer must be set so that a giant magnetoresistive effect of the scattering type is efficiently produced in the first magnetic layer, the thickness is preferably 200 Å or less, and more preferably 150 Å or less. However, if the thickness is excessively thin, the reproduction signal level decreases because the resistance of the cell decreases, and also it become difficult to maintain the magnetization. Therefore the thickness of the second magnetic layer is preferably 20 Å or more, and more preferably 80 Å or more.

Material and Thickness of the Non-Magnetic Layer

The non-magnetic layer is a good conductor and preferably includes Cu as a major constituent. Because Cu has a Fermi energy close to that of the magnetic layer and has a good adhesion, this results in a resistance change easily occurring at the interface when the magnetization direction changes, and thus a large magnetoresistance ratio can be obtained. Preferably, the non-magnetic layer has a thickness of 5 Å to 60 Å.

Alternatives

By providing a magnetic layer having Co as a major constituent between the first magnetic layer and the non-magnetic layer, or between the second magnetic layer and the non-magnetic layer, or between the first magnetic layer and the non-magnetic layer and between the second magnetic layer and the non-magnetic layer, the magnetoresistance ratio is increased, resulting in a higher S/N ratio. In such a case, the layer including Co as a major constituent preferably has a thickness of between 5 Å to 20 Å.

In order to improve the S/N ratio, each magnetoresistive film may be structured of a number of stacked units each composed of a first magnetic layer, a non-magnetic layer, a second magnetic layer and a non-magnetic layer. As the number of units to be stacked increases, the magnetoresistance ratio increases, which is preferable. However, if the number is excessively large, the thickness of the magnetoresistive film increases and a large quantity of electric current is required. Therefore the number of units to be stacked is preferably 40 or less, and more preferably between approximately 3 to 20.

Second Embodiment

A second embodiment of the present invention using perpendicular magnetic films as the first and second magnetic layers will now be described.

Figure 6:
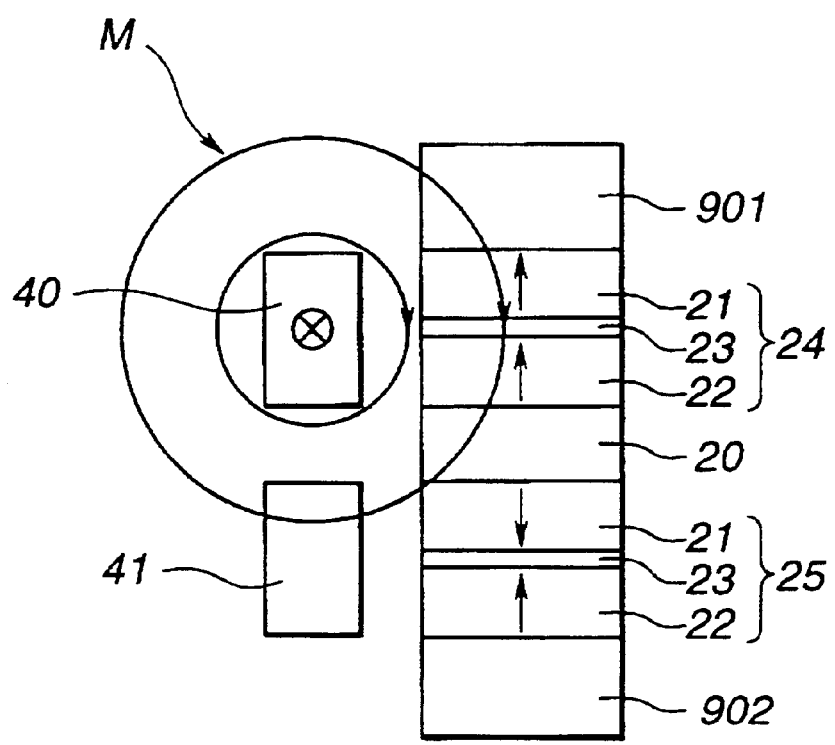
FIG. 6 is a sectional view illustrating the basic structure of the memory cell used in the second embodiment of the present invention.

FIG. 6 is a sectional view illustrating the basic structure of the memory cells used in this embodiment.

In the magnetic thin film memory of this embodiment the unit including the magnetoresistive film 24 is composed of a first magnetic layer 21 having a low coercive force, and a second magnetic layer 22 having a higher coercive force, with a non-magnetic layer 23 provided between the layers 21, 22. A write wire 40 consisting of a good conductor is provided separated by an insulator (not shown) from the magnetoresistive film 24. Two or more units are overlaid, 25 indicating another magnetoresistive film provided with write wire 41. The write wires 40 and 41 are not connected electrically as an insulator (not shown) is provided between the wires. Also, in order to prevent recording errors, a good conductor 20 may be provided between the magnetoresistive films 24 and 25. In FIG. 6, 901, 902 indicate electrodes provided for monitoring electric current flow between the electrodes 901, 902 during reproduction. These electrodes consist of a good conductor.

The magnetization information of "0"s or "1"s is recorded according to the spin direction, i.e., upward or downward, of the second magnetic layer 22. For example, where the information is recorded in the magnetoresistive film 24 in FIG. 6, the recording is performed by reversing the magnetization of the second magnetic layer 22 by a magnetic field M generated by the flow of electric current in the nearby write wire 40. FIG. 6 shows the case where the device is magnetized downwards by flow of electric current in the direction into the drawing. If the electric current flows in the opposite direction, it is possible for the magnetization to be upwards. Also then because the magnetic field generated by the write wire 40 is not effectively applied to the magnetoresistive film 25, the information in the magnetoresistive film 25 is not rewritten. Where information is recorded in the magnetoresistive film 25, the recording is performed by flow of electric current in the write wire 41. In this embodiment, it is possible to record the information of 2 bits or more in an area of the same size as a conventional memory cell. As a result, the integration rate is greatly improved.

Figure 7A:
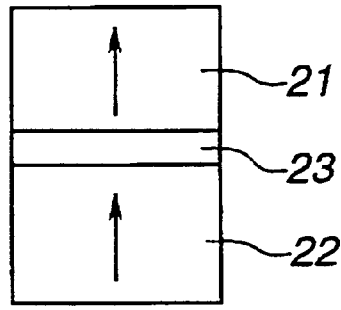
FIG. 7A and FIG. 7B illustrate two states of magnetization of the magnetoresistive film in the second embodiment.
Figure 7B:
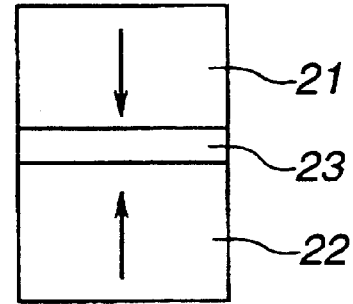

FIGS. 7A and 7b show magnetization states of each of the magnetoresistive films. An arrow indicates the direction of spin producing the magnetization. In FIG. 7A the directions of spin of the first and second magnetic layers 21, 22 are parallel to each other, and the resistance is low. In FIG. 7B the directions of spin of the first and second magnetic layers 21, 22 are opposite to each other, and the resistance is high.

As described in more detail below, it is possible to detect the recorded digital information by detecting the resistance change of the magnetoresistive films.

The write wire is set so that the magnetic field is generated in a direction perpendicular to the plane of the magnetoresistive film by application of the electric current. Thus, the write wire is arranged such that the electric current flows in parallel with the surface of the film. When the clearance between the write wire and the magnetoresistive film is large, a sufficient magnetic field can not be applied. When the clearance is small, dielectric breakdown may occur, or a tunnel electric current may flow. Accordingly, the clearance is set at between 10 Å and more, 1 $\mu$m or less, and preferably between 50 Å and 1000 Å.

Although FIG. 6 illustrates a memory in which two magnetoresistive units are stacked, the number of stacked units is not limited to two. In particular, it is possible to stack between 2 and 256 units. However, due to some problems, i.e., a decline of output signal, or a loss of flatness of the layer generated if the number of stacked units increases, the number of stacked units is preferably between 2 and 16.

Figure 8:
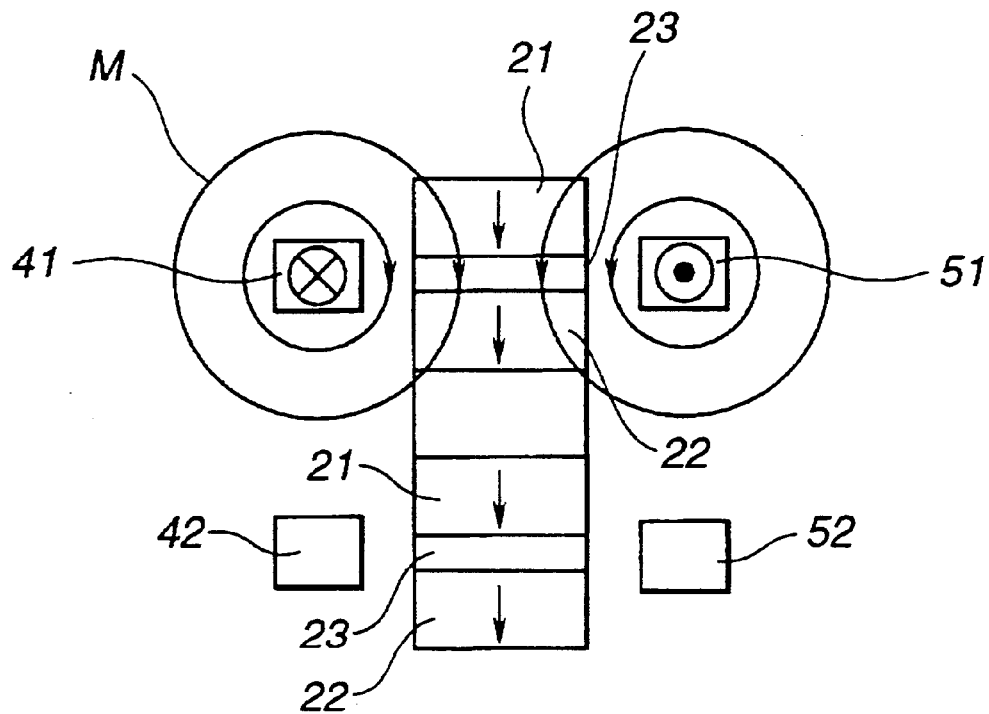
FIG. 8 is a sectional view of a structure provided with a wire for writing at both sides of the magnetoresistive film.

Referring now to FIG. 8, where two or more write wires are arranged near one magnetoresistive film, it is possible to generate a strong magnetic field on the magnetoresistive film because of the cooperation of the magnetic fields generated by the current flow in each wire.

In FIGS. 8, 41, 42, 51 and 52 indicate four write wires. As explained below, as the magnetic field for reproducing is weaker than that used for recording, it is preferable that the electric current flows in one write wire when reproducing and in two write wires when recording. Thereby, it is possible to get a large electric current margin between that used in recording and in reproducing. As the result, it is possible to reproduce information without causing recording errors.

It is possible to achieve one memory chip with a capacity of several 100 M bits or several G bits by arranging the units of this embodiment in a matrix arrangement. In this case, it is preferable that a common write wire is provided for a plurality of units. For example, a number of the devices shown in FIG. 6 may be arranged on the same plane and a common write wire provided to the devices. In this case, when the electric current flows in the write wire, the same magnetic field is applied to a number of units at the same time, the magnetic field thus recording the data in the other units. Thus, it is necessary to supply electric current in the magnetoresistive film of the unit to be recorded only in order to generate the required magnetic field. Therefore, it is preferable to provide an active device, i.e., a transistor, to each unit. Thereby, it is possible to select a particular unit among a large number of units.

Figure 9:
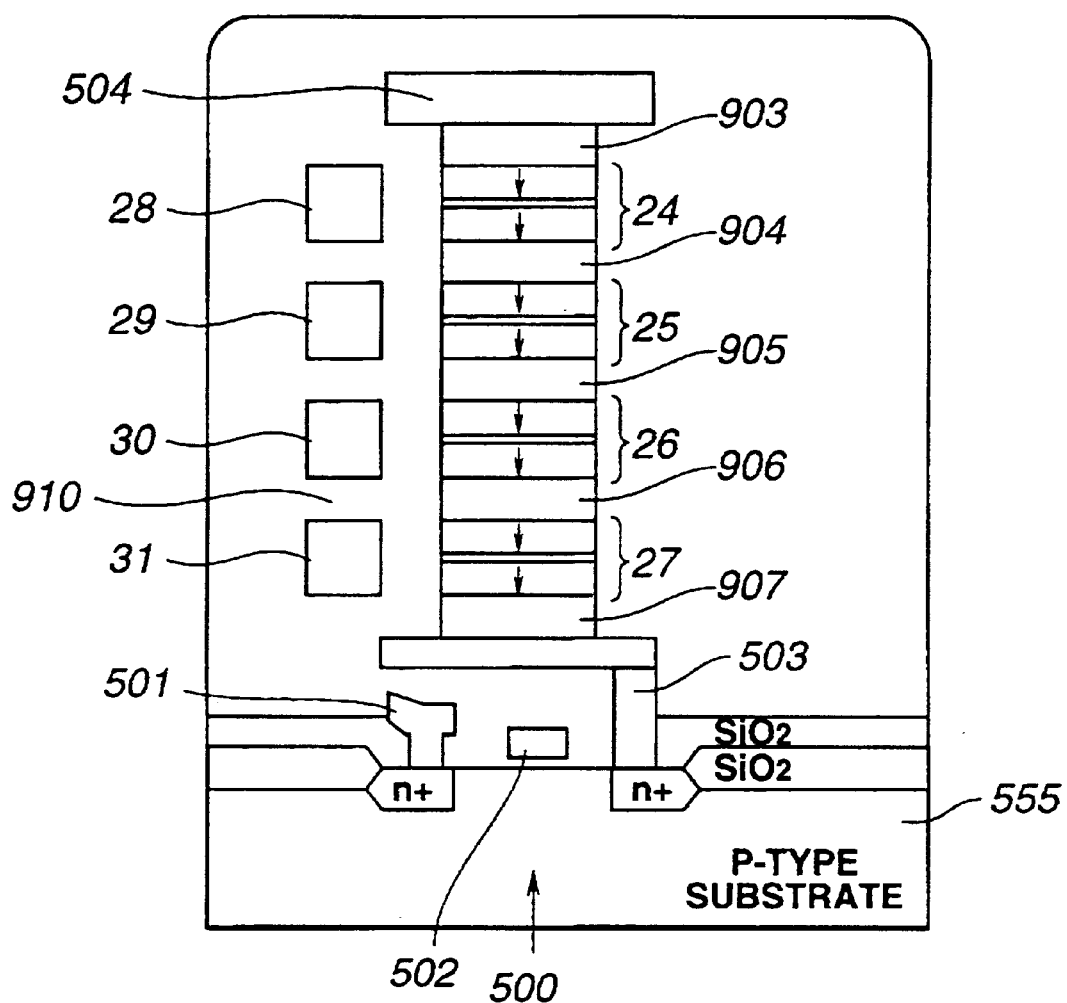
FIG. 9 is a sectional view showing the second embodiment of the magnetoresistive thin film memory of the present invention.

Such an arrangement is shown in FIG. 9. This shows one end of the memory connected to the drain electrode 503 of a field-effect transistor 500, the opposite end of the memory being connected to an electrode 504 which is in turn connected to an electric source potential VDD. The source electrode of the transistor 500 is denoted by 501, whilst 502 is the gate electrode. Four magnetoresistive films of the form shown in FIG. 6 are indicated by 24–27, whilst 28–31 indicate four write wires. The write wires are embedded in a dielectric material 910 in order to electrically insulate the write wires from each other and from the magnetoresistive layers. Conductive layers 904, 905, 906 are provided between each pair of magnetoresistive films 24–27, with further conductive layers 903 and 907 separating the upper and lower magnetoresistive films 24, 27 from the respective electrodes 504, 503.

In the arrangement of FIG. 9, it is possible to reverse the magnetization of a specified detection layer (i.e. the first magnetic layer) within each column of magnetoresistive films by applying a magnetic field to the specified unit 24, 25, 26, 27 by application of a current through one of the write wires 28–31, reproduction occurring in the same way as the recording to cause a resistance change in the specified unit. The resistance change is detected by being amplified by a sense circuit connected to the source electrode 501. As the result, it is possible to reproduce the information recorded on a specified unit among a large number of units formed on the substrate 555.

Figure 10A:
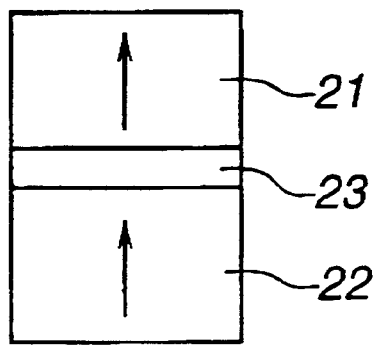
FIG. 10A, FIG. 10B, FIG. 11A and FIG. 11B illustrate changes of the magnetization of the magnetoresistive film used in the second embodiment.
Figure 10B:
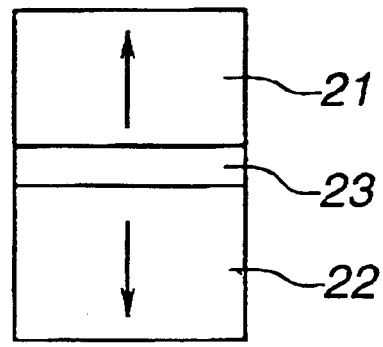
Figure 11A:
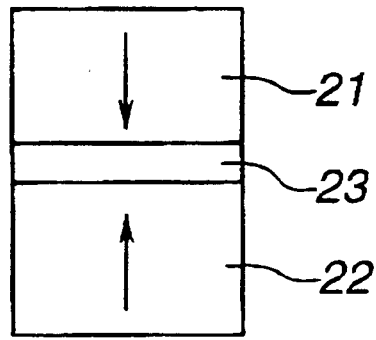
Figure 11B:
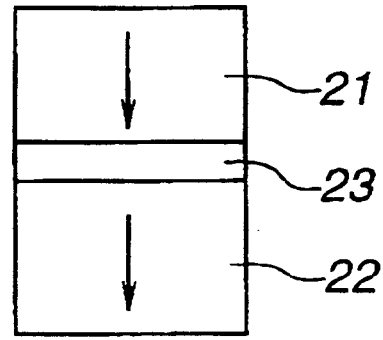

The second magnetic layer of the magnetic thin film memory of this embodiment is a memory layer for storing the magnetization information. The first magnetic layer is a detecting layer for reproducing the magnetization information stored in the second magnetic layer using the giant magnetoresistive effect. FIGS. 10A, 10B, 11A, 11B illustrate the magnetization states when recording and reproducing. In FIGS. 10A, 10B, 11A, 11B, data "0" is designated by the upward magnetization of the second magnetic layer 22 (FIG. 10A). Data "1" is designated by the downward magnetization of the second magnetic layer 22 (FIG. 10B). The recording is performed by reversing the magnetization of the second magnetic layer 22 by the recording magnetic field. Reproducing is performed by detecting the resistance change when the magnetization of the first magnetic layer 21 is then reversed.

The reproducing process will now be explained in detail.

The magnetic field for reproducing is generated by supplying electric current, weaker than that used for recording, to the write wire associated with a particular magnetoresistive unit or, as mentioned above, supplying the electric current to only one write wire of the provided two write wires. The magnetization of the detecting layer is reversed without reversing the magnetization of the memory layer by the magnetic field. For example, when "0" is recorded, the magnetization of the detecting layer is changed from the state shown in FIG. 10 to the state shown in FIG. 11, or vice versa. When "1" is recorded, the magnetization of the detecting layer is changed from the state of FIG. 10B to the state of FIG. 11B or vice versa. The resistance changes from low to high in the case of "0", and from high to low in the case of "1". Thus, recorded information can be detected by a change in resistance. In this method, even minute changes in signals can be detected using differential detection or the like, in comparison with a method in which the absolute value of resistance is detected, and thus, reproducing can be performed with high efficiency.

Alternatively, data "0"s and "1"s may be designated by respectively the downward and upward magnetization of the second magnetic layer 22.

Although, the above described RE-TM materials may be used as magnetic materials for the first magnetic layer and the second magnetic layer, since the magnetization of both layers must be reversed during the recording and the reproducing, GdFe, GdFeCo, or the like having a lower coercive force are preferably used.

If the coercive force of the first magnetic layer is too low, the reproducing signal deteriorates, whilst if it is too high, the electric current needed for reproducing increases. Accordingly, the coercive force of the first magnetic layer is preferably between 2 Oe and 20 Oe. Also, if the coercive force of the second magnetic layer is too low, the memory characteristics deteriorate, whilst if it is too high, the electric current needed for recording increases. Accordingly, the coercive force of the second magnetic layer is preferably between 5 Oe and 50 Oe. The coercive force of the first magnetic layer is preferably set at approximately half of that of the second magnetic layer.

Materials for the first and second magnetic layers include magnetic materials exhibiting perpendicular magnetization such as a ferrimagnetic film of an alloy of a rare earth element and a transition element of the iron group (RE-TM); a garnet film, that is a magnetic oxide film; or an artificial lattice film of a rare earth element and a transition metal of the iron group (RE-TM), PtCo, and PdCo.

As the RE-TM material, GdFe, GdFeCo, TbFe, TbFeCo, DyFe, DyFeCo, or the like are preferably used because of an easy exhibition of perpendicular magnetization. Among the magnetic films mentioned above, GdFe, or GdFeCo are preferable as the material for the first magnetic layer as these materials may have a low coercive force. As the materials for the second magnetic layer, TbFe, TbFeCo, DyFe, DyFeCo, or the like are preferable, these materials may have a higher coercive force. When the reversal of magnetization is caused by a magnetic field generated by an electric current, the required electric current value may be excessively large because of the excessively high coercive force in those materials. Therefore, preferably, using GdFe, GdFeCo, or the like, the composition may be adjusted so that the second magnetic layer has a larger coercive force than that of the first magnetic layer.

As mentioned above, in the memory device of this embodiment, the resistance varies depending on whether the spin directions of the first magnetic layer and the second magnetic layer are parallel or antiparallel. For example, when the spin direction of the first magnetic layer and the second magnetic layer are parallel, the resistance is low, whilst when the spin directions of the first magnetic layer and the second magnetic layer are antiparallel, the resistance is high.

Figure 12A:
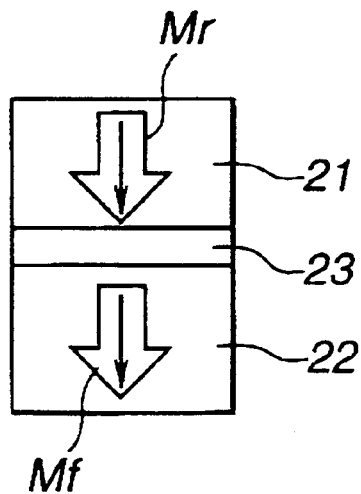
FIG. 12A and FIG. 12B illustrate two states of magnetization of a magnetoresistive film formed from a rare-earth/transition metal alloy.
Figure 12B:
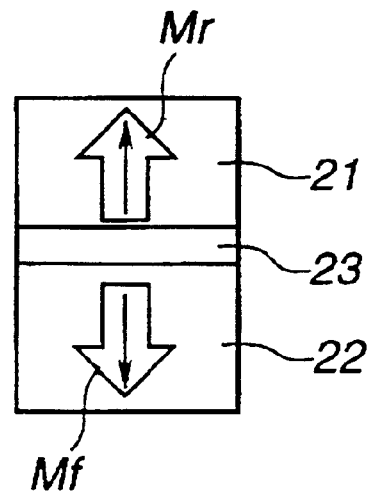

A further explanation of the use of a RE-TM alloy will now be made with reference to FIG. 12A and FIG. 12B. In FIGS. 12A and 12B, the outline arrows represent the net magnetization direction Mr, which corresponds to the difference in magnetization between a rare earth element and an element of the iron group, whilst the black arrow represents the magnetization direction Mf of a transition element of the iron group. When the magnetic film is a ferrimagnetic film composed of a rare earth element and a transition element of the iron group, the sub-lattice magnetizations of the individual element are antiparallel. The magnetization of the rare earth element is caused by 4f electrons. However, since the 4f electrons are deep within an inner shell, they do not greatly contribute to electric conductivity. On the other hand, some of the 3d electrons of the transition element of the iron group are conduction electrons because they are near an outer shell. Therefore, magnetoresistance depending on a difference in the spin direction is more easily influenced by the spins of the transition metal element of the iron group. Accordingly, the spin direction of the element of the iron group is considered as the spin direction contributing to magnetoresistance. In the example shown in FIG. 12A, when the magnetic moment of the element of the element of the iron group of the first magnetic layer is parallel to that of the second magnetic layer, the resistance is small, whilst in the example shown in FIG. 12B, where the moments are antiparallel, the resistance is large.

Although, in FIG. 12A and FIG. 12B, both layers are iron group-rich (TM-rich), the net magnetization of the magnetic layer and the magnetization of the element of the iron group being in the same direction, it does not matter even if the first magnetic layer is rare earth element-rich (RE-rich) and the second magnetic layer is TM rich, or vice versa.

Since the magnetic thin film memory in the this embodiment has a magnetoresistive film composed of a perpendicular magnetic film, in comparison with an inplan magnetic film, there is a large difference in stability of the magnetization when each unit is made very small in size. Specifically, when the magnetoresistive film is composed of a known magnetoresistive film such as NiFe/Cu/Co, that layer has a saturation magnetization of approximately 800 emu/cc or more. If the width of each unit is in the submicron range, the demagnetizing field increases because the magnetic poles on the edges of the film are close to each other, and the spins rotate along the side edges of the film. On the contrary, in a perpendicular magnetic film, the demagnetizing energy is smaller than the perpendicular anisotropy constant, and therefore, the maximum saturation magnetization is suppressed to approximately 300 emu/cc or less. Also, because magnetic poles exist at the upper and lower surfaces of the layer, even if each unit is narrow in the width direction, there is no closure of the magnetic poles. Accordingly, the demagnetizing field does not increase and the magnetization can be maintained sufficiently stable even over a submicron width. As a result, it is possible to improve the density.

In this embodiment, the saturation magnetization of the perpendicular magnetic film is preferably 250 emu/cc or less, more preferably, 200 emu/cc or less. However, the saturation magnetization is preferably at least 50 emu/cc because if the saturation magnetization is excessively small, the coercive force becomes excessively large.

A magnetic thin film memory of this embodiment, in one example, has a non-magnetic layer having a good conductivity between the first magnetic layer and the second magnetic layer, that is to produce the type of memory called a spin scattering type of memory. The non-magnetic layer preferably has a higher conductivity than that of the first magnetic layer and the second magnetic layer, and, is for example, Cu. Since a good conductor having Cu as a major constituent has a Fermi energy close to that of the magnetic layer and has good adhesion, the resistance change easily occurs at the interface when the magnetization direction changes. Thus, a large magnetoresistance ratio can be obtained. Preferably, the non-magnetic layer has a thickness of 5 Å to 60 Å.

By providing a magnetic layer having Co as a major constituent, between the first magnetic layer and the non-magnetic layer, or between the second magnetic layer and non-magnetic layer, or between both the first magnetic layer and the non-magnetic layer, and the second magnetic layer and the non-magnetic layer, the magnetoresistance ratio is increased, resulting in a higher S/N ratio. In such a case, the layer including Co as a major constituent preferably has a thickness of between 5 Å and 20 Å.

The thickness of the first magnetic layer must be set so that a giant magnetoresistive effect is efficiently produced. In particular, if the thickness of the first magnetic layer largely exceeds the mean free path of the electrons, the effect decreases because of phonon scattering. Thus the thickness is preferably at least 200 Å or less, and more preferably 150 Å or less. However, if the first magnetic layer is excessively thin, the reproduction signal decreases because the resistance of the cell decreases and also it become difficult to maintain the magnetization. Therefore the thickness of the first magnetic layer is preferably 20 Å or more, and more preferably 80 Å or more.

Since the thickness of the second magnetic layer must be set so that a giant magnetoresistive effect of the scattering type is efficiently produced as in the first magnetic layer, the thickness is preferably 200 Å or less, and more preferably 150 Å or less. However, if the thickness is excessively thin, the reproduction signal decreases because the resistance of the cell decreases and also it become difficult to maintain the magnetization. Therefore the thickness of the second magnetic layer is preferably 20 Å or more, and more preferably 80 Å or more.

In order to improve the S/N ratio, the magnetoresistive film may be structured as a unit composed of a first magnetic layer, a non-magnetic layer, a second magnetic layer and a non-magnetic layer. The units are overlaid a number of times. The more the number of units, the higher the magnetoresistance ratio, which is preferable. However, if the number is excessively large, the thickness of the magnetoresistive film increases and a large electric current is required. Therefore the number of units to be deposited is preferably 40 or less, and more preferably approximately 3 to 20.

The magnetic thin film of this embodiment, as in the other embodiments, arranges for a layer of a non-magnetic insulator between the first magnetic layer and the second magnetic layer to form a spin tunnel film. In particular, the device is structured so that tunnelling of electrons from the first magnetic layer to the second magnetic layer occurs when a electric current is supplied the direction perpendicular to the film surface during reproducing.

In the spin tunnel magnetic type thin film memory of this embodiment, the electron states of an upward spin and those of a downward spin in the Fermi surface are different because the conduction electrons of a ferromagnetic metal have a spin polarization. Therefore, a ferromagnetic tunnel junction of this embodiment, which is composed of a ferromagnetic material, an insulator and a ferromagnetic material, causes conduction electrons of the ferromagnetic metal to tunnel while maintaining their spin state. As a result, the tunnelling probability varies dependent on the magnetization state of both magnetic layers, resulting in a change in tunnel resistance. Accordingly, when the magnetization of the first and second magnetic layers are parallel, the resistance is small, whilst when the magnetization of the first and second magnetic layers are antiparallel, the resistance is large. The more the density difference between the upward and downward spins increase, the more the resistance increases. It is therefore possible to obtain a larger output signal. Therefore, preferably, a magnetic material having a high spin polarization ratio is used for the first and second magnetic layers. In particular, Fe, which has a high polarization ratio of upward and downward spins at the Fermi surface, is selected as a major constituent, with Co selected as a second constituent.

The thickness of the first magnetic layer and the second magnetic layer is preferably between 500 Å and 5000 Å. The reasons are as follows:

1. When an oxide is used as the insulator, magnetism near the interface of the magnetic layer at the side of the non-magnetic layer is weakened under the influence of the oxide. The portion with the weakened magnetism dominates the entire magnetic film if the thickness is small.
2. When Aluminium Oxide is used as the non-magnetic layer and is formed by introducing oxygen after the Al layer is formed, Al of approximately 10 Å remains in the non-magnetic layer. It becomes difficult to ignore the bad influence of the Al if the thickness is 100 Å or less, resulting in a good memory characteristic not being obtained.
3. When each memory device has a submicron size, the characteristic for maintaining the magnetization of the first and second magnetic layers deteriorates. Also, if the thickness is excessively large, the resistance of the cell increases excessively. Therefore, the thickness is preferably 5000 Å or less, and more preferably, 1000 Å or less.

Since the magnetic thin film memory described above uses the magnetoresistive effect by spin tunnelling, the non-magnetic layer must be an insulating layer so that electrons tunnel while retaining their spin state. The non-magnetic layer may be entirely insulating, or may be partially insulating. As an example in which the oxide layer is formed by oxidizing a non-magnetic metal film, $Al_2O_3$ is formed by oxidizing a portion of Al film in air or in a vacuum by plasma oxidation. Other examples are $AlN_x$, $SiO_x$, $SiN_x$, $NiO_x$. $AlO_x$ is preferable. In order to cause spin tunnelling, an appropriate potential barrier is required to the energy of the conduction electrons of the first and second magnetic layers. The above described materials relatively easily produce the barrier and also have production advantages.

The non-magnetic layer is a uniform layer having a thickness of approximately several tens of Å. The thickness of the insulating portion of the layer is preferably between 5 Å and 30 Å. This is because there is a possibility of a short circuit between the first and second magnetic layers if the thickness is less than 5 Å and tunnelling of electrons does not easily occur if the thickness is more than 30 Å. More preferably, the thickness is between 4 Å and 25 Å and still more preferably, the thickness is between 6 Å and 18 Å.

The second embodiment of the invention will now be explained in further detail as follows, with reference to an example.

EXAMPLE 1

A magnetic thin film memory has the structure shown in FIG. 6. with four magnetoresistive units. The first magnetic layer is formed of $Gd_{18}Fe_{82}$. The thickness of the layer is 4 nm. The coercive force is 5 Oe. The non-magnetic layer is formed of Cu. The thickness of the layer is 5 nm. The second magnetic layer is formed of $Gd_{19}Fe_{81}$. The thickness is 10 nm. The coercive force is 15 Oe. The write wire is formed from Al.

Firstly, recording was performed on the magnetic thin film memory by supplying a 20 mA electric current into each write wire arranged at the side of each unit, and changing the direction of the electric current. Thus, a representation of the data representing "0", "1", "1", "0" was recorded in the units.

Next, reproducing was performed to the recorded magnetic thin film memory by supplying an electric current of 10 mA into each write wire in the direction into the plane of the drawing, reversing only the magnetization of the first magnetic layer, and detecting the resistance change of the magnetoresistive film. As a result, resistance changes corresponding to the recorded information was obtained. In other words, reproduction of the data was performed correctly.

Third Embodiment

A third embodiment of the present invention, in which the first magnetic layer and the second magnetic layer form a cylinder or a rectangular solid, is explained as follows.

Figure 13:
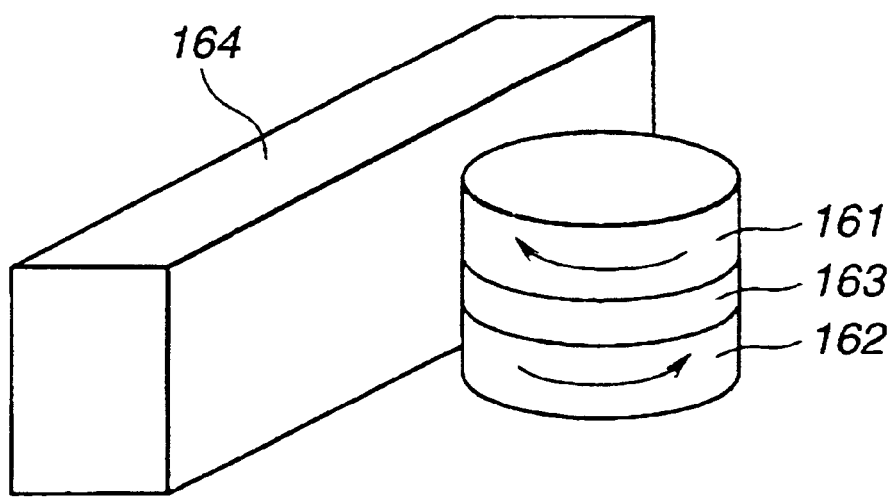
FIG. 13 is a perspective view illustrating the basic structure of a memory cell used in the third embodiment of the present invention.

FIG. 13 illustrates a perspective view of the basic structure of the memory cells of the third embodiment.

In FIG. 13, the first magnetic layer, the second magnetic layer, and the non-magnetic layer are indicated by 161, 162, 163 respectively. The write selection wire is indicated by 164. The write selection wire 164 is separated by an insulator (not shown) near the cylindrical magnetic layers 161, 162. An arrow indicates the direction of magnetization of each magnetic layer 161, 162. The first magnetic layer 161 and the second magnetic layer 162 are cylindrical in shape. The magnetization of the first and second magnetic layers 161, 162 are oriented as a loop along a side wall of the cylinder. Therefore, in comparison with a conventional memory, it is possible to store stably the magnetization because magnetic poles do not appear at the end surfaces of the magnetic layers.

The magnetic thin film memory of this embodiment exhibits a low resistance when the magnetizations of the first magnetic layer and the second magnetic layer are parallel to each other, and a high resistance when they are antiparallel. Accordingly, it is possible to reproduce the recorded information because the resistance of each memory device will be different dependent on the direction of the magnetization of the first and second magnetic layers.

Figure 14A:
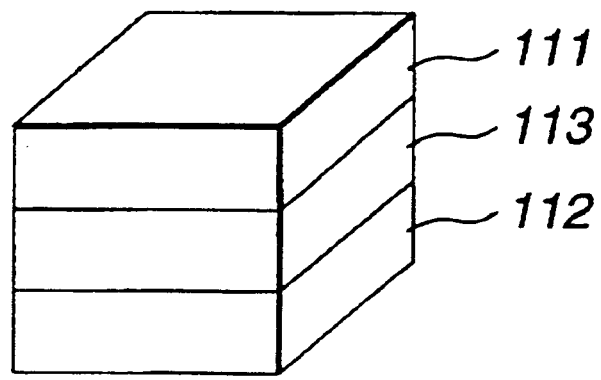
FIG. 14A and FIG. 14B illustrate structures in which the magnetoresistive film has a square shaped cylindrical magnetoresistive film in the third embodiment.
Figure 14B:
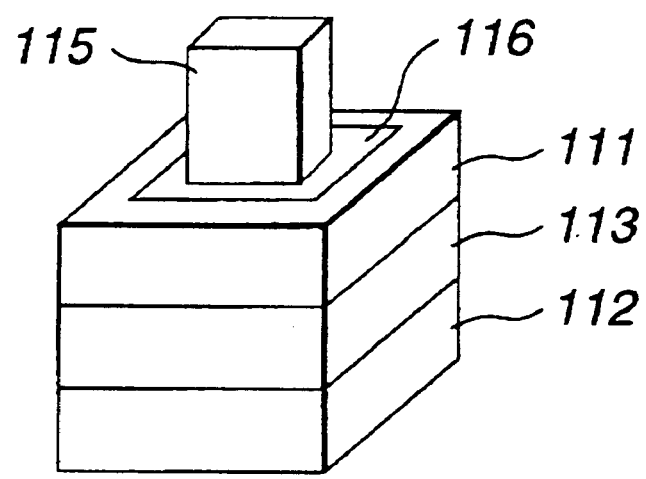

The first and second magnetic layers have only to form a closed magnetic circuit. As a result, the shape of the layers may be so as to form a rectangular solid as shown in FIGS. 14A and 14B. In FIG. 14A and FIG. 14B, 111, 112, 113, 115, 116 indicate respectively a first magnetic layer, a second magnetic layer, a non-magnetic layer, a write selection wire, and an insulator. However, the cylindrical shape is preferable because the maximum value of curvature in the magnetization direction is smallest.

Referring again to FIG. 13, representations of the data "0" and "1" are recorded by means of the direction, i.e. the clockwise or anticlockwise direction of the magnetization of the first magnetic layer or the second magnetic layer. The recording is performed by supplying electric current in the direction perpendicular to the surface of the layers such that the magnetization of the first magnetic layer or the second magnetic layer is reversed by the magnetic field generated by the current. For example, as described above in FIG. 13, if the electric current flows from the second magnetic layer to the first magnetic layer, a magnetic field having an anti-clockwise direction is generated and the magnetization of the second magnetic layer 162 is magnetized in the direction of the anti-clockwise direction.

Figure 15:
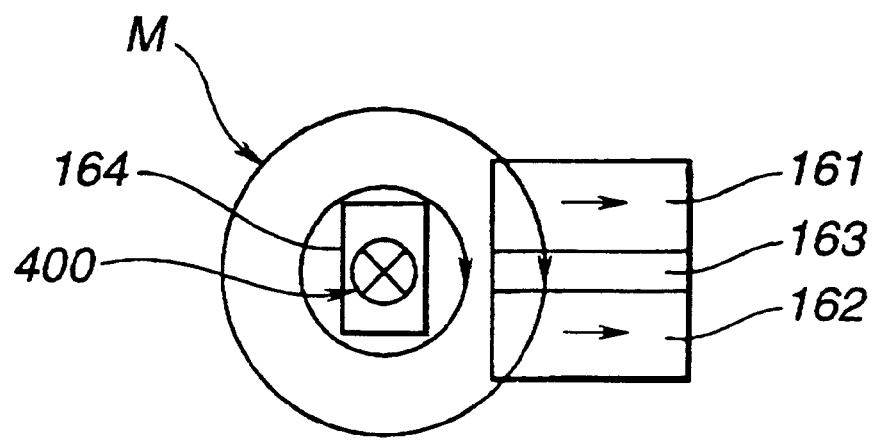
FIG. 15 illustrates the two states of the magnetization of the magnetoresistive film in the memory cell shown in FIG. 13.

In FIG. 15, 400 indicates the direction of flow of the electric current. The electric current flowing in the write selection wire 164 generates a magnetic field in a direction perpendicular to the surface of the layers 161, 162. This magnetic field can not determine the magnetization direction of the magnetic layers itself, but this magnetic field can help the reversal of the magnetization.

When recording, whether the magnetization of the first or second magnetic layer is reversed depends on the type of medium.

A first type of medium has a structure comprising a memory layer (the first magnetic layer), a non-magnetic layer and a pin layer (the second magnetic layer). In this structure, the first magnetic layer stores the information, whilst the magnetization of the second magnetic layer is always oriented in one direction. The recording is performed by reversing the magnetization of the first magnetic layer. The reproducing, as described below, is performed by detecting the absolute value of resistance without the reversal of the magnetization.

A second type of medium has a structure comprising a detecting layer (the first magnetic layer), a non-magnetic layer and a memory layer (the second magnetic layer). In this structure, the magnetization of the first magnetic layer is reversed in order to detect the resistance change when reproducing. The second magnetic layer stores the information. The recording is performed by reversing the magnetization of the second magnetic layer.

In both types, the first magnetic layer has a low coercive force and the second magnetic layer has a higher coercive force than the first magnetic layer.

Figure 16:
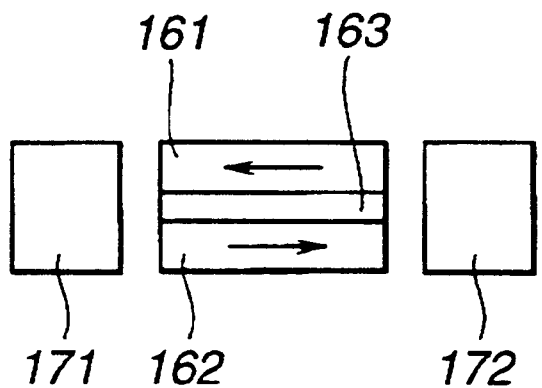
FIG. 16 is a sectional view of a structure provided with a wire for writing at both sides of the magnetoresistive film.

The write selection wire may be arranged at either side, i.e. the right side or left side, of the magnetic layers. Also, as shown in FIG. 16, the write selection wires 171, 172 may be arranged at both sides of the layers 161, 162. In FIG. 16, if the electric current is supplied in opposite directions in the write selection wire 171 and the write selection wire 172, it is possible to reverse the magnetization more easily because a larger magnetic field can be generated.

Also, in above second type, if the electric current is supplied to only one write selection wire when reproducing and supplied to both write selection wire when recording, it is possible to obtain a large margin of the electric current between the recording and the reproducing. As the result, it is possible to reproduce stably without creating recording errors.

Figure 17A:
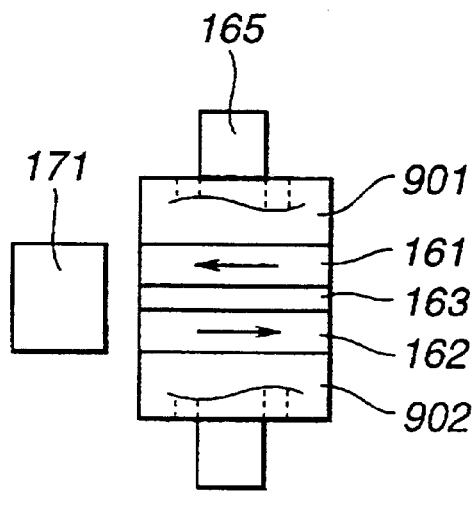
FIGS. 17A and 17B are sectional views of memory cells provided with one write selection wire (FIG. 17A) or two write selection wires (FIG. 17B)
Figure 17B:
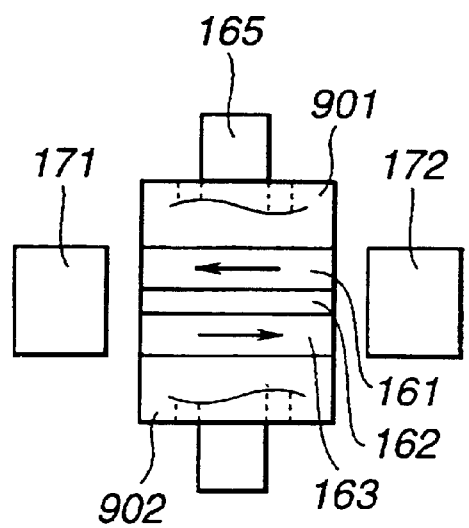
Figure 18:
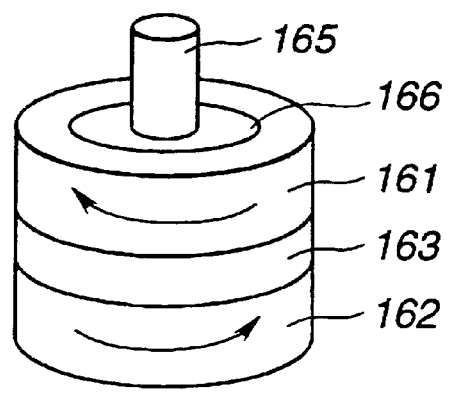
FIG. 18 is a perspective view of the memory cell of FIGS. 17A and 17B provided with a write determining wire.

FIG. 17A and FIG. 17B show another example of the structure of the memory cell of this embodiment. In FIG. 17A and FIG. 17B, 163 indicates the non-magnetic layer between the first and second magnetic layers 161, 162. Electrodes 901, 902 consisting of a good conductor are provided on the outer surfaces of the first magnetic layer and the second magnetic layer in order to enable electric current to flow between the electrodes 901, 902 during reproduction. The write determining wire 165, which consists of a conductor, is surrounded by a insulator 166, this being more clearly shown in FIG. 18. The write determining wire 165 is provided at the centre portion of the first magnetic layer and the second magnetic layer as shown in FIG. 17 also in the rectangular solid embodiment of FIG. 14B. This write determining wire 165 carries current to reverse the magnetization when recording and consists of a higher conductivity material than that of the magnetic layers. The insulator 166 is provided in order to prevent the write determining wire 165 from electrically connection with the magnetic layers. However, if the thickness of the insulator is excessively thick, the magnetic field which is applied to the magnetic layer becomes small because the distance between the write determining wire 165 and the magnetic layers become larger. Therefore, it is preferable that the thickness is as thick as possible in a range which is able to insulate. Also, the write selection wire 171, 172 may be arranged at only one side of the magnetic layer or at both side of it as shown in FIG. 17A and FIG. 17B.

In the structure shown in FIG. 17A and FIG. 17B, because the electric current flows through the magnetic layers when recording, the wiring resistance declines in comparison with the structure in FIG. 13. As a result, it is possible to improve the consumption of electric current and the recording speed. Reproducing is performed by supplying electric current for reproducing into the write determining wire 165, and then detecting the resistance value between the electrodes 901, 902.

Figure 19:
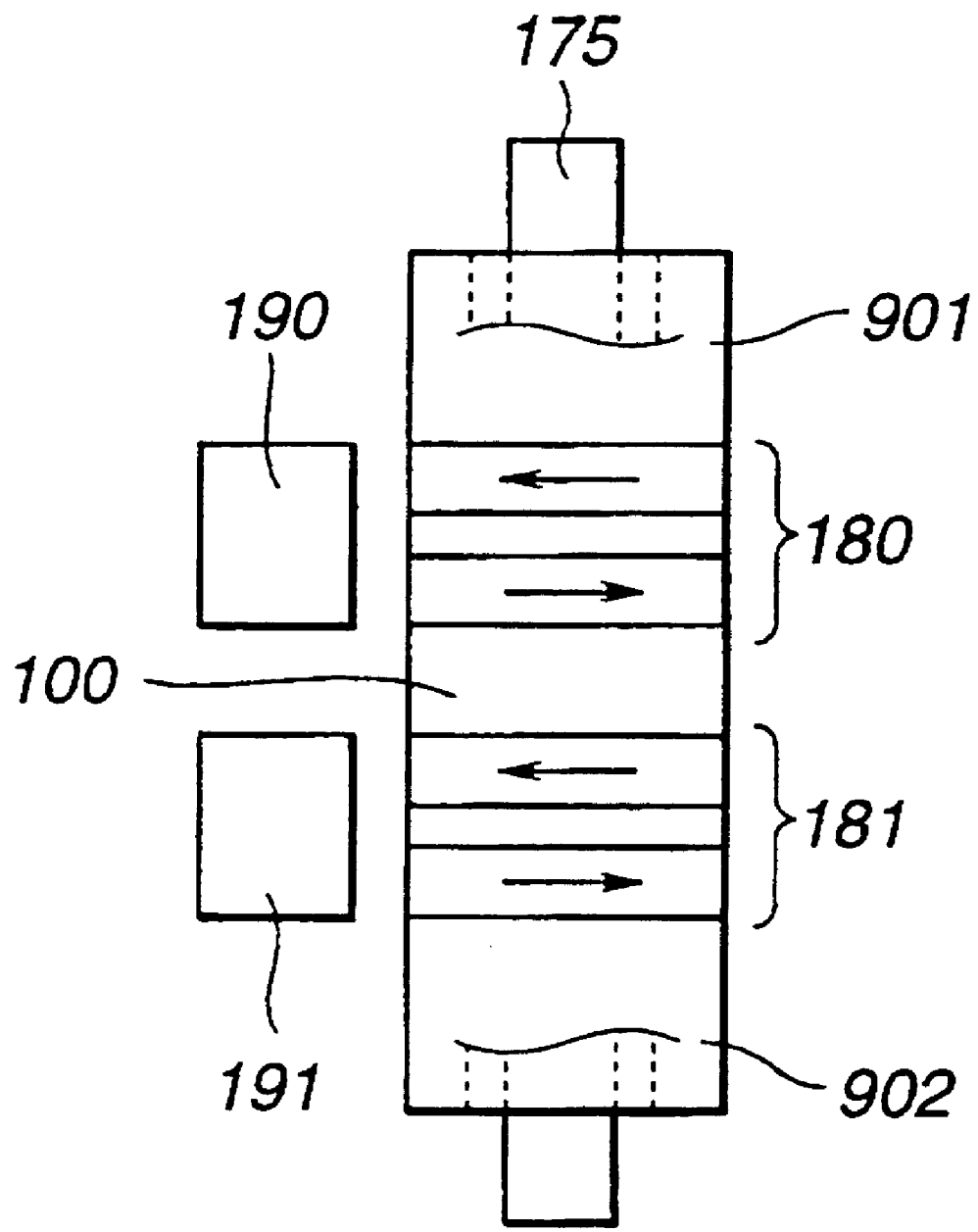
FIG. 19 is a sectional view of the magnetic thin film memory comprising overlaid cells of the third embodiment.

In this embodiment, it is possible to overlie a plurality of the memory cells because the write selection wires 171 are arranged to the side of the magnetic layers. For example, as shown in FIG. 19, two magnetoresistive films 180, 181 each comprising a first magnetic layer, a non-magnetic layer and a second magnetic layer are overlaid in a serial structure.

When recording is performed on the magnetoresistive film 180, the write selection wire 190 and the write determining wire 175 are used. When recording is performed on the magnetoresistive film 181, the write selection wire 191 and the write determining wire 175 is used. Thereby, a large applied magnetic field can be applied to only a particular magnetoresistive film and it is possible to record the information selectively on the particular magnetoresistive film. It is preferable to arrange a conductor 100 between the magnetoresistive film 180 and the magnetoresistive film 181 in order to prevent errors in recording.

The reproducing is performed by detecting the resistive value of each magnetoresistive film. The detection is performed by supplying electric current between electrodes 901, 902, reversing the magnetization of the first magnetic layer of the magnetoresistive film which should be readout by using the write selection wire 190 or the write selection wire 191, and then detecting the resistance change between both electrodes. Thereby, it is possible to reproduce the information from a particular magnetoresistive film. Accordingly, in the case of a multiple structure, the above second type of medium is preferable.

Figure 20:
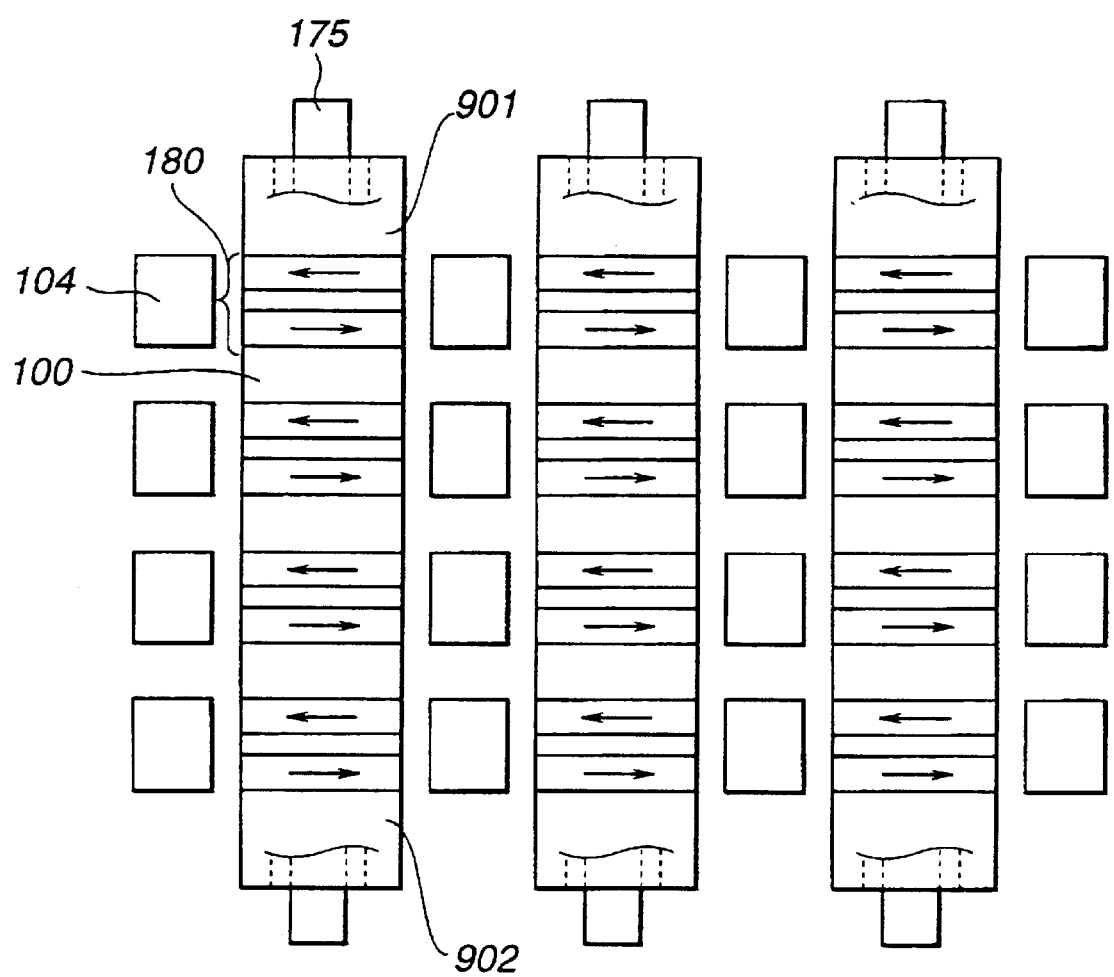
FIG. 20 is a sectional view illustrating another structure of the magnetic thin film memory of the third embodiment.

FIG. 20 shows a structure of three parallel lines of four magnetoresistive films connected in series.

Figure 21:
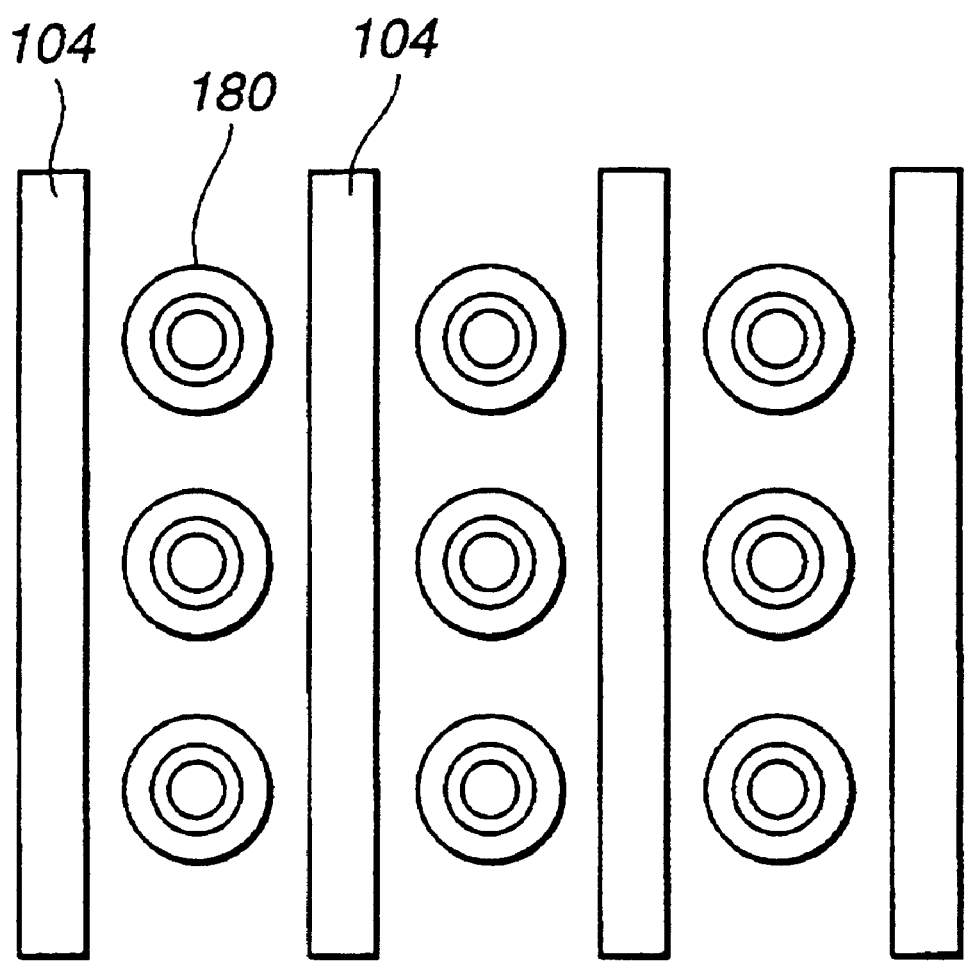
FIG. 21 is a plan view of the structure shown in FIG. 20.

In this case, the write selection wires 104 are arranged on both sides of each magnetoresistive film 180. The write selection wires for selecting a magnetoresistive film 180 are arranged on both sides of the magnetoresistive film as more clearly seen in FIG. 21 which shows a top plan view of the structure shown in FIG. 20.

Although the case in which four magnetoresistive films are overlaid is shown in FIG. 20, the number of overlaid magnetoresistive films is not limited to four. In particular, it is possible to deposit between 2 and 256 magnetoresistive films. However, because of some problems, i.e., a decline of output signal, or a loss of flatness of the layers generated if the number of deposited magnetoresistive films increases, the number of deposited magnetoresistive films is preferably between two and 16.

Figure 22:
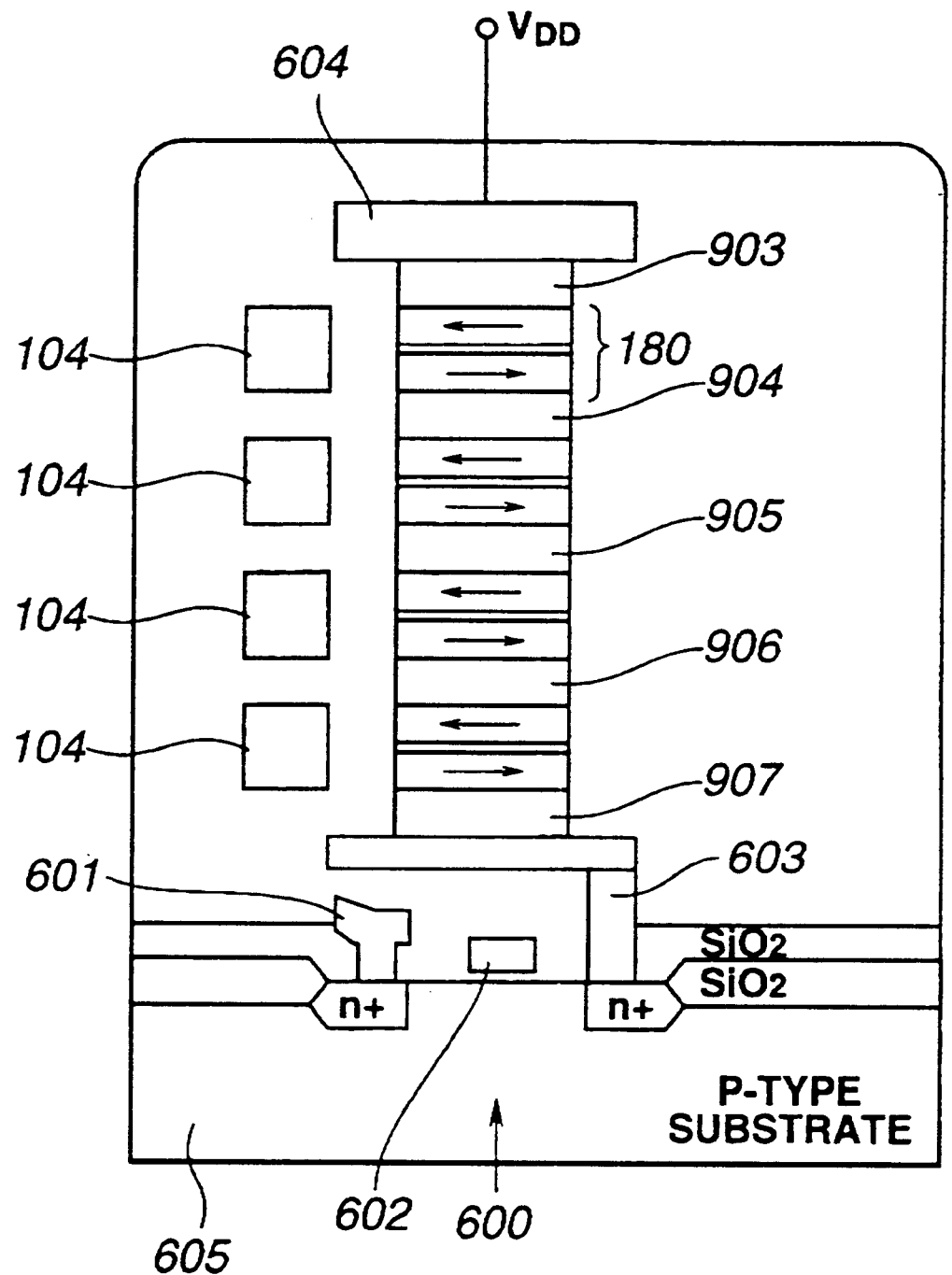
FIG. 22 is a sectional view of a magnetic thin film memory having a semiconductor hybrid structure according to the third embodiment.

FIG. 22 shows a semiconductor hybrid structure in which the magnetic thin film memory of this embodiment comprising a stack of magnetoresistive films 180, each associated with a respective write selection wire 104 connected to a semiconductor transistor 600 formed on a p-type substrate 605. The lowest layer of four stacked magnetoresistive films is connected to a drain electrode 603 of the transistor 600, the other end of the layers being connected to a electrode 604 to which is applied a constant potential VDD. 601 is a source electrode. 903, 904, 905, 906, 907 indicate conductive layers.

Although not shown in the figures, by arranging a large number of the structure shown in FIG. 22 including the memory and transistor arrangement on the same substrate 605, one memory chip may achieve a capacity of several 100 M bits or several G bits.

Because this semiconductor device is composed of a gate electrode 602 and a source electrode 601, it is possible to select a particular memory device among a large number of memory devices. After selection, it is possible to record and/or reproduce the information on a particular magnetoresistive film among a number of magnetoresistive film as described above. The reproduction signal is amplified by a sense amplifier after extraction of the signal though the source electrode.

When recording, it is preferably that a magnetic field is generated of at least 5 Oe and more, more preferably, 10 Oe. This reason is that if the magnetic field is too small, it become difficult to store stably the information because the magnetoresistive film must have a smaller coercive force. Also, the magnetic field must not be too large because if the electric current exceeds a limiting electric current density in order to generate too large a magnetic field, the wire may easily snap because of electromigration, and furthermore the electric current consumed increases.

If the wire used in the semiconductor device consists of Tungsten, this has a relatively high limiting electric current density, typically 20 mA/$\mu$m$^2$. In order to reduce the consumption of electric current and the generation of heat from the device, the electric current is preferably about 1 mA.

In order to generate the magnetic field of 5 Oe necessary to record, the length of the current path, that is, the length of the write determining wire through which the recording electric current must flow must be at least 0.05 $\mu$m. The longer the length, the larger the range over which the magnetic field is applied. Preferably, the length is 0.1 $\mu$m and more, more preferably, 0.15 $\mu$m and more, and still more preferably, 0.20 $\mu$m and more.

However, if the length is too long, the time for forming the write determining wire 165 increases. Also it becomes difficult to ensure the wire is perpendicular to the surface of the substrate, and there is the possibility that erroneous recording occurs in an adjacent memory device by the inclination of the wire. Therefore, the length is preferably 2 $\mu$m and less, more preferably, 1 $\mu$m and less, and still more preferably, 0.5 m and less.

The magnetoresistive film used in the magnetic thin film memory of this embodiment, utilizes the effect in which the electric current flows perpendicular to the surface of the magnetoresistive film when reproducing (CPP-MR). Since CPP-MR has a high probability of causing a conduction electron to cross the interface in comparison with CIP electric current in-plane to the plane of the film (CIP-MR) in which the electric current flows in the in-plane direction to the surface of the magnetoresistive film, it is possible to obtain a highly sensitive signal, in which large magnetoresistance changes can be obtained.

A spin tunnel film structure or a spin scattering film structure can be used as the film structure of this embodiment. These film structures can be applied to both the above described structures in which each unit comprises a memory layer, a non-magnetic layer, a magnetic pin layer and detecting layer, a non-magnetic layer and a memory layer. However, the spin tunnel film is preferable because a spin tunnel film can produce a large magnetoresistance ratio and a high resistance value of 1 k$\Omega$ and more. As a result it is possible to ignore the bad influence caused by the dispersion of the on-resistance (about 1 k$\Omega$) of a semiconductor device.

Also, in the spin tunnel film structure, a thin insulator is used as non-magnetic layer. This can be structured so that tunnelling of electrons from the first magnetic layer to the second magnetic layer occurs when a electric current is supplied perpendicular to the film surface during reproducing.

In the spin tunnel magnetic thin film memory of this embodiment, the electron states of an upward spin and that of a downward spin in the Fermi surface are different because conduction electrons in a ferromagnetic metal have a spin polarization. Therefore, a ferromagnetic tunnel junction of this embodiment, which is composed of a ferromagnetic material, an insulator and a ferromagnetic material, causes conduction electrons of the ferromagnetic metal to tunnel while maintaining the state of its spin. As a result, the tunnel probability varies dependent on the magnetization state of both magnetic layers, resulting in change in tunnel resistance. Accordingly, when the magnetization of the first magnetic layer and the second magnetic layer are parallel, the resistance is small, and when the magnetization of the first magnetic layer and the second magnetic layer are antiparallel, the resistance is large. The more the difference in density between the upward spins and the downward spins increase, the more the resistance increases. It is thus possible to obtain a larger output signal. Therefore, preferably, a magnetic material having a high spin polarization ratio is used for the first and second magnetic layers.

As a specific example of the first and second magnetic layers, Fe, which has high polarization ratio of upward and downward spins at the Fermi surface, is selected as a major constituent, with Co selected as a second constituent.

Whilst Fe, Co, Ni are preferably selected as the major constituent, Fe, Co, FeCo, NiFe, NiFeCo are more preferable. A composition of $Ni_xFe_{100-x}$ is preferable where x is between 0 and 82. More specific examples are Fe, Co, $Ni_{72}Fe_{28}$, $Ni_{51}Fe_{49}$, $Ni_{42}Fe_{58}$, $Ni_{25}Fe_{75}$, $Ni_9Fe_{91}$.

In order to decrease the coercive force of the first magnetic layer, NiFe, NiFeCo, Fe are preferable. In order to increase the coercive force of the second magnetic layer, preferably, Co is selected as the major constituent.

The thickness of the first magnetic layer and the second magnetic layer of the magnetic thin film memory in this embodiment is preferably between 100 Å and 5000 Å. The reason is as follows:

1. When an oxide is used as the insulator, magnetism at the interface of the magnetic layer on the side of the non-magnetic layer is weakened under the influence of the oxide. The portion with weakened magnetism dominates the entire magnetic film if the thickness is small.

2. When Al oxide, as the non-magnetic layer, is formed by introducing oxygen after a layer of Al has been formed, Al of approximately 10 Å thickness remains in the non-magnetic layer. It becomes difficult to ignore the adverse influence of the Al if the thickness is 100 Å or less, with the result that a good memory characteristic is not obtained.

3. When each memory device is refined to the submicron range, the characteristics for maintaining the magnetization of the first and second magnetic layers decline. Also, if the thickness is excessively large, the resistance of the cell increases excessively. Therefore, the thickness is preferably 5000 Å or less, and more preferably, 1000 Å or less.

Since the magnetic thin film memory uses the spin tunnelling magnetoresistive effect, the non-magnetic layer must be an insulating layer so that electrons tunnel while retaining the spin state. The non-magnetic layer may be entirely insulating, or may be partially insulating. As examples in which an oxide layer is formed by oxidizing a non-magnetic metal film, $Al_2O_3$ may be formed by oxidizing a portion of Al film in air or in a vacuum by plasma oxidation. Other examples are $AlN_x$, $SiO_x$, $SiN_x$, $NiO_x$. In particular, $AlO_x$ is preferable. Also, in order to cause spin tunnelling, an appropriate potential barrier is required to the energy of conduction electrons of the first and second magnetic layers. $AlO_x$ relatively easily produce the barrier and also has production advantages.

The non-magnetic layer is a uniform layer having a thickness of approximately several tens of Ångstroms. The thickness of the insulating portion is preferably between 5 Å and 30 Å. This is because there is a possibility of a short circuit between the first and second magnetic layers if the thickness is less than 5 Å and tunnelling of electrons does not easily occur if the thickness is more than 30 Å. More preferably, the thickness is between 4 Å and 25 Å, and still more preferably, the thickness is between 6 Å and 18 Å.

Also, in the spin scattering film structure, a metal layer, which consists of a good conductor, is used as non-magnetic layer. The spin scattering magnetoresistive effect results from the spin dependent scattering of conduction electrons. Because conduction electrons having a spin of the same direction to the direction of the magnetization are not largely scattered, the magnetoresistive effect is small. But, because a conduction electron having a spin of the opposite direction to the direction of the magnetization is largely scattered, the magnetoresistive effect becomes large due to the scattering. Therefore, when the magnetization of the first and second magnetic layers are the opposite directions to each other, the magnetoresistive effect become larger than when the magnetization of the layers is in the same direction to each other.

In this structure, the first magnetic layer forms a loop of the magnetic field itself and is provided in order to reproduce the information stored in the second magnetic layer utilizing the giant magnetoresistive effect. It is preferable that the first magnetic layer is composed of amorphous alloy which consists of at least one of Fe, Co as a major constituent or which consists of CoFe as the major constituent. For example, the first magnetic layer is preferably composed of the magnetic film which consist of at least one of NiFe, NiFeCo, FeCo, CoFeB. The composition ratio of $Ni_xFe_{100-x}$ is preferably such that x is between 35 and 86. The composition ratio of $Ni_x(Fe_{100-y}Co_y)_{100-x}$ is preferably such that x is between 10 and 70 and y is between 30 and 90; more preferably, y is between 60 and 85. Also, it is preferable that the first magnetic layer is composed of an amorphous magnetic material which consists of CoFeB, for example, $CO_{84}Fe_9B_7$ or $Co_{72}Fe_8B_{20}$.

The second magnetic layer is provided mainly in order to store the information by means of the direction of the magnetization of the layer. The second magnetic layer must be able to store stably the information and must be able to efficiently generate the giant magnetoresistive effect as in the first magnetic layer. It is preferable that the second magnetic layer is composed of a magnetic film, i.e. Fe, FeCo, Co, which consists of at least one of Fe and Co as a major constituent. Also, an additive atom, for example Pt etc., is preferably added in the second magnetic layer in order to improve the corrosion resistance or control the coercive force.

In order to control of the coercive force, if Fe is added to Co, the coercive force of the magnetic layer become smaller. If Pt is added to Co, the coercive force becomes higher. Accordingly the coercive force of the second magnetic layer $Co_{100-x-y}Fe_xPt_y$ can be controlled by adjusting the atomic composition x and y. Also, the coercive force of the first magnetic layer can be controlled in the same way. Alternatively, because the coercive force become higher by rising the temperature of substrate while the magnetic layer is forming, so the coercive force can be controlled by adjusting the temperature of substrate while the magnetic layer is forming. This may be combined with adjustment of the composition ratio.

The thickness of the first magnetic layer must be set so that a giant magnetoresistive effect of the scattering type is efficiently produced. In CPP-MR, the distance the spin can move while maintaining the direction of spin, namely the spin diffusion length, is a important factor. In particular, if the thickness of the first magnetic layer largely exceeds the mean free path of the electrons, the effect decreases because of phonon scattering, and thus the thickness is preferably at least 200 Å or less, more preferably 150 Å or less. However, if the first magnetic layer is excessively thin, the output reproduction signal decreases because the resistance of the cell decreases and also it becomes difficult to maintain the magnetization. Therefore the thickness of the first magnetic layer is preferably 20 Å or more, more preferably 80 Å or more.

Since the thickness of the second magnetic layer must be set so that a giant magnetoresistive effect of the scattering type is efficiently produced the same as in the first magnetic layer, the thickness is preferably 200 Å or less, and more preferably 150 Å or less. However, if the thickness is excessively thin, the output reproduction signal decreases because the resistance of the cell decreases and also it become difficult to maintain the magnetization. Therefore the thickness of the second magnetic layer is preferably 20 Å or more, and more preferably 80 Å or more.

The non-magnetic layer consists of a good conductor preferably including Cu as a major constituent. Because Cu has a Fermi energy close to that of the magnetic layer and have good adhesion, as the result, resistance easily occurs at the interface when the magnetization direction changes, and a large magnetoresistance ration can be obtain. Also, preferably, the non-magnetic layer has a thickness of between 5 Å to 60 Å.

By providing a magnetic layer having Co as a major constituent, between the first magnetic layer and the non-magnetic layer, or between the second magnetic layer and non-magnetic layer, or both between the first magnetic layer and the non-magnetic layer and between the second magnetic layer and the non-magnetic layer, the magnetoresistance ratio is increased, resulting in a higher S/N ratio. In such a case, the layer including Co as a major constituent preferably has a thickness of 20 Å and less.

In order to improve the S/N ratio, the magnetoresistive film may be structured as a unit composed of a first magnetic layer, a non-magnetic layer, a second magnetic layer and a non-magnetic layer, the units being overlaid a plurality of times. The more the number of units increases, the higher the magnetoresistive ratio. However, if the number is excessively large, the thickness of the magnetoresistive film increases and a large volume of electric current is required. Therefore the number of units current for reproducing is preferably 40 or less, and more preferably approximately 3 to 20.

In the magnetic thin film memory of this embodiment, an antiferromagnetic layer may be arranged on the side of the second magnetic layer remote from the non-magnetic layer. Thereby, because exchange coupling occurs between the second magnetic layer and the antiferromagnetic layer, the magnetization of the second magnetic layer can be adjusted and the coercive force of the second magnetic layer can be higher. In such a case, it is possible to use the same material for the first magnetic layer and the second magnetic layer. As a result, it is possible to enlarge the range of materials to be chosen from because the MR ratio is not sacrificed in order to get a large coercive force. NiO, FeMn, CoO, etc. are preferable as the antiferromagnetic layer.

This embodiment will now be explained in further detail as follows, with reference to an example.

EXAMPLE 2

The magnetic thin film memory has a structure as shown in FIG. 19 including two magnetoresistive films.

The first magnetic layer in each magnetoresistive film is formed from $Ni_{80}Fe_{20}$, with a thickness of 25 nm, and a coercive force of 10 Oe. The material of the non-magnetic layer is Cu. The material for the non-magnetic layer is $Al_2O_3$, the thickness is 5 nm. The second magnetic layer is formed of Co, with a thickness of 25 nm, and a coercive force of 20 Oe. The write selection wire is formed from Al.

First, recording was performed on the magnetic thin film memory by supplying an electric current of 25 mA, into each write selection wire 190, 191 at the side of each unit and changing the direction of the electric current. Data representing "1"s and "0"s was recorded in the units.

Next, reproducing was performed on the recorded magnetic thin film memory by supplying an electric current of 10 mA into each write selection wire in the direction into the plane of the drawing, reversing only the magnetization of the first magnetic layer, and detecting the resistance change of the magnetoresistive film. As a result, a resistance change corresponding to the recorded information was obtained. That is, reproducing was performed correctly.

The magnetic thin film memory of the present invention described in above embodiment may be used as a memory medium for recording on or reproducing from by various apparatus.

Figure 23:
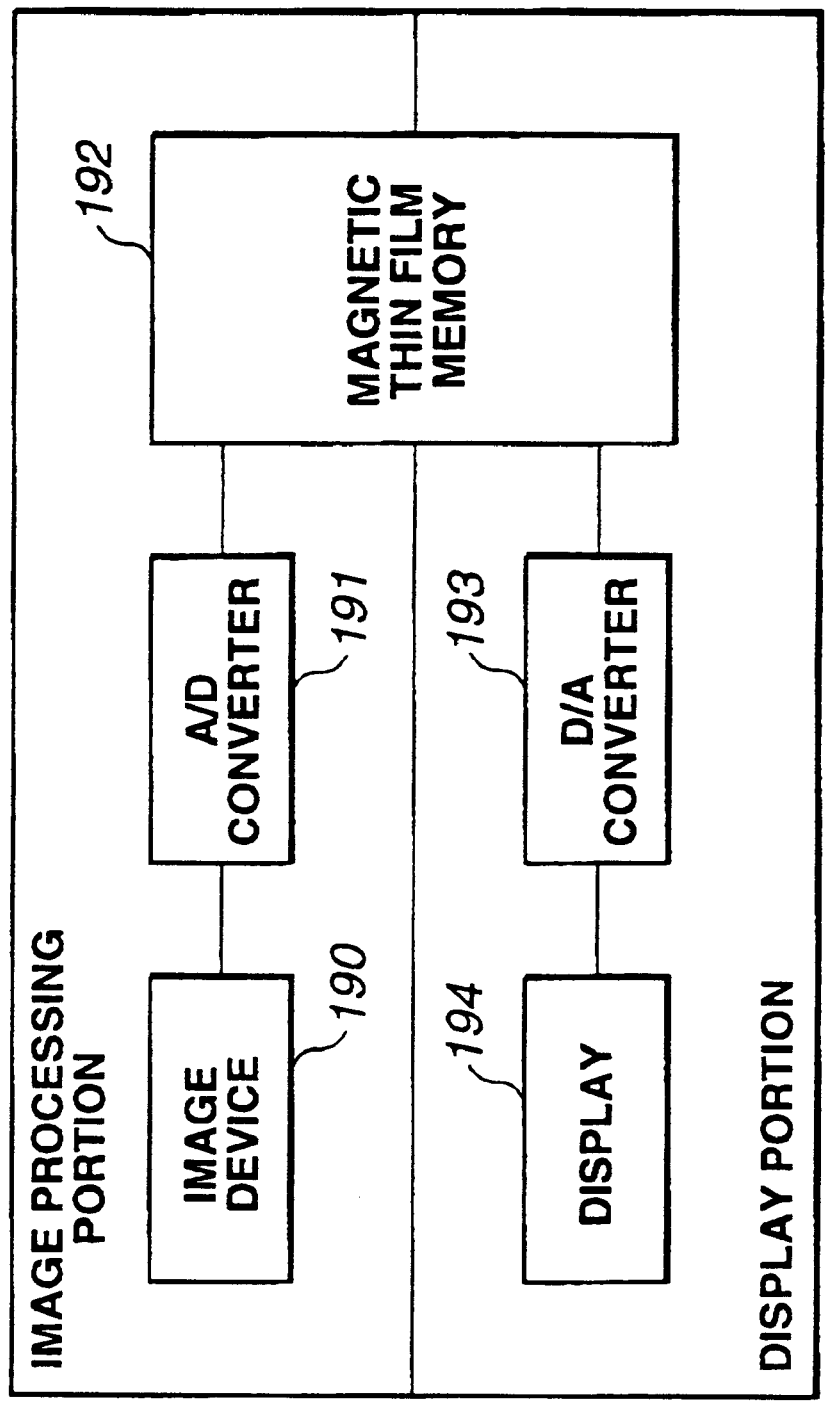
FIG. 23 is a schematic drawing of an imaging apparatus including a magnetic thin film memory in accordance with an embodiment of the present invention.

FIG. 23 illustrates an example of a image recording and/or reproducing apparatus utilizing the magnetic thin film memory of the present invention.

In the apparatus, in order to record information an image is imaged though a lens system (not shown) onto an imaging device 190, for example an array of photosensors. An output signal from the imaging device 190 is converted to a digital signal by A/D convertor 191. The digital signal is recorded into the magnetic thin film memory 192 as described in more detail with reference to FIG. 24.

Figure 24:
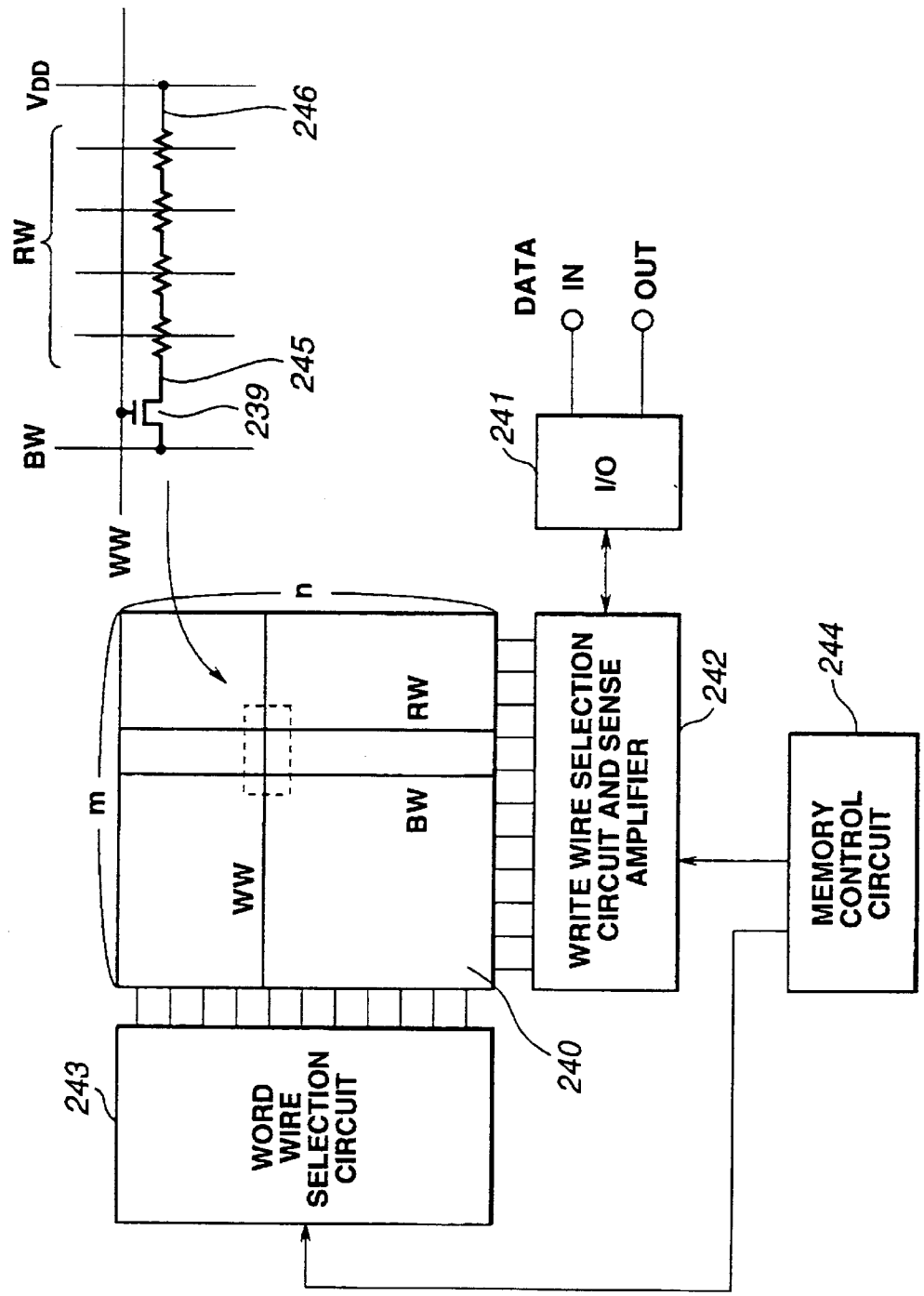
FIG. 24 illustrates the magnetic thin film incorporated in the imaging apparatus of FIG. 23.

Turning now to FIG. 24, this figure illustrates the structure of the magnetic thin film memory shown in FIG. 23. This memory is generally of the same form as illustrated in FIG. 9 or FIG. 22 and includes a transistor 239 for each stack of magnetoresistive units, an m x n array of such stacks being arranged on the same substrate. When recording, each bit of information output from the A/D converter 191 is used to address write wire selection circuit and sense amplifier 242 through input/output circuit 241. The write wire selection circuit 242 determines the direction of the electric current to be applied depending on the input bit, i.e., "0" or "1". The memory control circuit 244 selects the appropriate bit wire BW, word wire WW and write wire RW and supplies an appropriate electric current to the selected wires, the selected word wire being addressed by switching on the relevant transistor 239. Thereby, the appropriate memory device is selected among a plurality of the memory device arranged in the m x n matrix and thus the data is recorded. By repeating this for each bit of information, digital image information representative of the original image is recorded in the magnetic thin film memory.

When reproducing, memory control circuit 244 selects the memory device storing the image information required to be readout in order by selecting the appropriate bit wire BW, word wire WW and write wire RW and reading out the digital information by means of the monitored resistance changes measured between the electrodes 245, 246 at the opposite ends of each stack of magnetoresistive thin film units by supplying a current through the relevant bit wire BW with the relevant transistor switched on. The readout information is output to D/A converter 193 through input/output circuit 241 and converted to an analog signal. The analog signal is then displayed on a display 194 after processing by a processing circuit (not shown).

Figure 25:
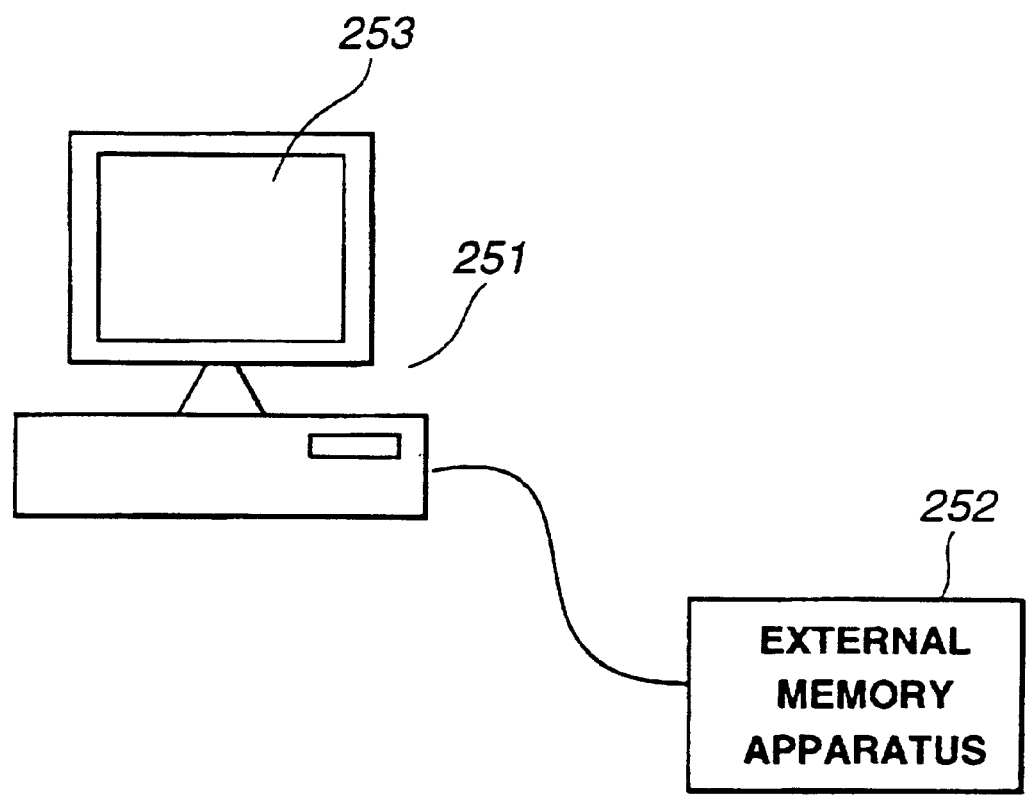
FIG. 25 illustrates the use of a magnetic thin film memory as an external memory to a computer.

FIG. 25 illustrates a computer system including an external memory apparatus 252 utilizing the magnetic thin film memory of the present invention.

In FIG. 25, the structure of the external memory apparatus is the same as shown in FIG. 24. Accordingly, the detailed description of recording and reproducing is omitted.

When recording, a command is sent to the external memory apparatus from the computer 251. The external memory apparatus then records the information sent from computer, in a plurality of memory devices of the form illustrated in FIG. 24. During reproducing a command is sent to the external memory apparatus 252. The external memory apparatus then performs reproduction of the recorded information requested from the computer 251. The reproduced information is then sent to computer and displayed as required on the display 253 of the computer 251.

While the present invention has been described with reference to what are presently considered to be preferred embodiments, it is to be understood that the invention is not limited to the disclosed embodiment. On the contrary, the invention is intend to cover various modifications and equivalent arrangements included within the spirit and scope of the appended claim. The scope of the following claims is to be accorded the broadest interpretation so as to encompass all such modifications and equivalent structures and functions.

What I claim is:

1. A magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction.

2. A magnetic thin film memory according to claim 1, wherein the non-magnetic layer is electrically conductive.

3. A magnetic thin film memory according to claim 1, wherein the non-magnetic layer comprises an insulator.

4. A magnetic thin film memory according to claim 1, wherein the write wire circuitry comprises a write wire arranged at each of the opposing surfaces of each magnetic thin film device.

5. A magnetic thin film memory according to claim 1, wherein the first magnetic layer and the second magnetic layer comprise perpendicular magnetization films.

6. A magnetic thin film memory according to claim 5, wherein the write wire circuitry comprises a pair of write wires arranged at opposite edges of each magnetic thin film device.

7. A magnetic thin film memory according to claim 1, wherein the first magnetic layer and the second magnetic layer are formed as a rectangular solid or as a cylinder, and the first and second magnetic layers have a preferred direction of magnetization in the plane of the layers.

8. A magnetic thin film memory according to claim 7, wherein each magnetic thin film device has a write determining wire, which has a conductivity greater than that of the first and second magnetic layers and is surrounded by an insulator, the write determining wire passing through the first and second magnetic layers.

9. A magnetic thin film memory according to claim 1, wherein the magnetization of the first magnetic layer and the second magnetic layer are oriented in opposite directions to each other when an external magnetic field is not applied.

10. A magnetic thin film memory according to claim 1, including an array of said plurality of magnetic thin film devices.

11. A magnetic thin film memory according to claim 10, wherein each of said plurality of magnetic thin film devices is formed on a semiconductor substrate on which is formed a field-effect transistor effective to control the current path to said electrode means.

12. A recording method for recording information on a magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, the method comprising the steps of:

supplying electric current into the write wire circuitry so as to generate a magnetic field in the region of a selected thin film device; and changing the direction of current flow dependent on the information to be recorded so as to change the direction of the magnetic field thereby aligning the direction of the magnetization of the second magnetic layer of the selected device with the magnetic field so as to record the information in the magnetic thin film memory.

13. A reproducing method for reproducing information recorded on a magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, on the basis of the direction of magnetization of the second magnetic layer in a selected magnetic thin film device, the method comprising the steps of:

supplying electric current into the write wire circuitry so as to generate a magnetic field in the region of a selected magnetic thin film device;

reversing the direction of magnetization of the first magnetic layer of the selected device by the magnetic field;

detecting any resistance change caused by said reversal of said plurality of magnetic thin film devices including the selected magnetic thin film device; and reproducing the information from the magnetic thin film device on the basis of said resistance change.

14. An apparatus for recording information on a magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, the apparatus comprising:

circuitry for enabling the supply of electric current to the write wire means so as to generate a magnetic field in the region of a selected thin film device; and current reversal circuitry for changing the direction of current flow dependent on the information to be recorded so as to change the direction of the magnetic field and align the direction of the magnetization of the second magnetic layer of the selected device with the generated magnetic field thereby recording the information in the magnetic thin film memory.

15. An apparatus for reproducing information from a magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, the apparatus comprising:

current supply circuitry for enabling the supply of electric current into the write wire circuitry so as to generate a magnetic field in the region of a selected magnetic thin film device thereby reversing the direction of magnetization of the first magnetic layer of the selected device by the generated magnetic field;

resistance change detection circuitry for detecting any resistance change of the selected magnetic thin film device caused by said reversal; and reproducing circuitry for reproducing the information from the magnetic thin film device on the basis of said resistance change.

16. An image recording apparatus for recording a representation of an image, including:

an imaging apparatus for converting the image to a binary electrical signal; and an apparatus for recording a magnetic thin film device with information representative of the electrical signal including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, the apparatus comprising:

circuitry for enabling the supply of electric current to the write wire means so as to generate a magnetic field in the region of a selected thin film device; and current reversal circuitry for changing the direction of current flow dependent on the information to be recorded so as to change the direction of the magnetic field and align the direction of the magnetization of the second magnetic layer of the selected device with the generated magnetic field thereby recording the information in the magnetic thin film memory.

17. An image reproducing apparatus for reproducing a representation of a stored image from a magnetic thin film memory including:

a plurality of magnetic thin film devices each comprising a first magnetic layer, a second magnetic layer of higher coercive force than the first magnetic layer laminated with the first magnetic layer and with a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, an apparatus for reproducing information from a magnetic thin film memory including:

a plurality of magnetic thin film devices each comprising a first magnetic layer, a second magnetic layer of higher coercive force than the first magnetic layer on the first magnetic layer, and a non-magnetic layer between the first magnetic layer and the second magnetic layer;

conductive write wire circuitry in respect of each device separated from the associated magnetic thin film device by an insulator, and electrode circuitry for enabling electric current flow in each magnetic layer for detection of changes in magnetoresistance, wherein said plurality of magnetic thin film devices are layered in the direction perpendicular to the surface of each magnetic layer, and said electrode circuitry is arranged so that electric current is able to flow through each magnetic layer in said perpendicular direction, the apparatus comprising:

current supply circuitry for enabling the supply of electric current into the write wire circuitry so as to generate a magnetic field in the region of a selected magnetic thin film device thereby reversing the direction of magnetization of the first magnetic layer of the selected device by the generated magnetic field;

resistance change detection circuitry for detecting any resistance change of the selected magnetic thin film device caused by said reversal;

reproducing circuitry for reproducing the information from the magnetic thin film device on the basis of said resistance change; and a display apparatus for displaying an image representative of the information reproduced from the magnetic thin film memory.

* * * * *

UNITED STATES PATENT AND TRADEMARK OFFICE
CERTIFICATE OF CORRECTION

PATENT NO. : 6,104,632
DATED : August 15, 2000
INVENTOR(S) : NAOKI NISHIMURA

It is certified that error appears in the above-identified patent and that said Letters Patent is hereby corrected as shown below:

ON THE TITLE PAGE [56] References Cited:

OTHER PUBLICATIONS, "No., Jun. 30, 1997" should read
--No. 6, Jun. 30, 1997--.

COLUMN 3:

Line 2, "show a" should read --show an--.

COLUMN 5:

Line 54, "the" (second occurrence) should be deleted.

COLUMN 7:

Line 24, "preferably" should read --preferable--.

COLUMN 13:

Line 1, "the" (second occurrence) should be deleted.

COLUMN 17:

Line 39, "connection" should read --connecting--.

COLUMN 18:

Line 59, "though" should read --through--;
Line 61, "preferably" should read --preferable--; and
Line 64, "become" should read --becomes--.

UNITED STATES PATENT AND TRADEMARK OFFICE
CERTIFICATE OF CORRECTION

PATENT NO. : 6,104,632
DATED : August 15, 2000
INVENTOR(S) : NAOKI NISHIMURA

It is certified that error appears in the above-identified patent and that said Letters Patent is hereby corrected as shown below:

COLUMN 22:

Line 16, "obtain." should read --obtained.--.

COLUMN 24:

Line 13, "intend" should read --intended--.

COLUMN 28:

Line 16, "an apparatus" should read --including an apparatus--.

Signed and Sealed this

First Day of May, 2001

Attest:

NICHOLAS P. GODICI

Attesting Officer

Acting Director of the United States Patent and Trademark Office